(12) United States Patent
Lee et al.

(10) Patent No.: US 12,191,146 B2
(45) Date of Patent: Jan. 7, 2025

(54) METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventors: Yung-Yao Lee, Hsinchu County (TW); Chen Yi Hsu, Hsinchu County (TW); Wei-Hsiang Tseng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 136 days.

(21) Appl. No.: 17/883,661

(22) Filed: Aug. 9, 2022

(65) Prior Publication Data

US 2022/0384174 A1    Dec. 1, 2022

Related U.S. Application Data

(63) Continuation of application No. 16/548,867, filed on Aug. 23, 2019, now Pat. No. 11,482,417.

(51) Int. Cl.
*H01L 21/027* (2006.01)
*H01L 21/324* (2006.01)
*H01L 21/687* (2006.01)

(52) U.S. Cl.
CPC .......... *H01L 21/027* (2013.01); *H01L 21/324* (2013.01)

(58) Field of Classification Search
CPC .................. H01L 21/027; H01L 21/0274
See application file for complete search history.

(56) References Cited

U.S. PATENT DOCUMENTS

| | | | | |
|---|---|---|---|---|
| 6,240,874 B1* | 6/2001 | Pike | ......................... | G03F 7/30 427/559 |
| 2003/0045098 A1* | 3/2003 | Verhaverbeke | ... | H01L 21/67173 438/689 |
| 2008/0268136 A1* | 10/2008 | Tokunaga | .............. | H10K 50/81 427/66 |
| 2015/0296563 A1* | 10/2015 | Wang | ................ | H01L 21/67109 219/521 |
| 2016/0231653 A1* | 8/2016 | Nagasaka | ........... | G03F 7/70341 |

* cited by examiner

*Primary Examiner* — Brian Turner
(74) *Attorney, Agent, or Firm* — WPAT LAW; Anthony King

(57) ABSTRACT

A method includes providing a first plate including a first surface, a second surface opposite to the first surface, and a first recess indented from the first surface towards the second surface; providing a semiconductor structure including a third surface, a fourth surface opposite to the third surface, and a first sidewall extending between the third surface and the fourth surface; placing the semiconductor structure over the first plate; and disposing a priming material over the third surface of the semiconductor structure, wherein a peripheral portion of the fourth surface of the semiconductor structure is in contact with the first surface of the first plate upon the disposing of the priming material.

20 Claims, 24 Drawing Sheets

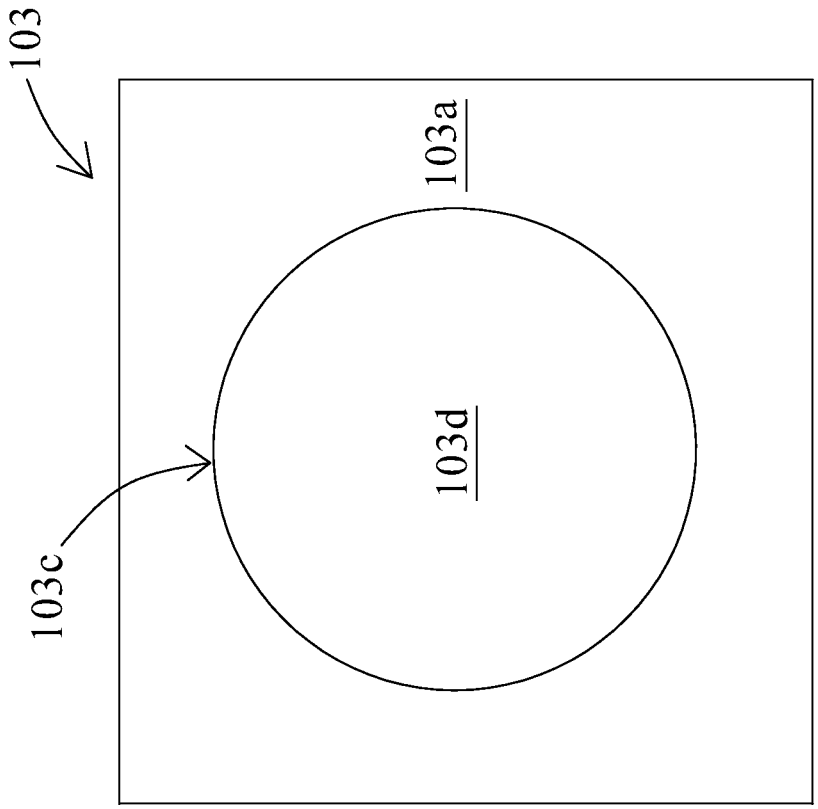
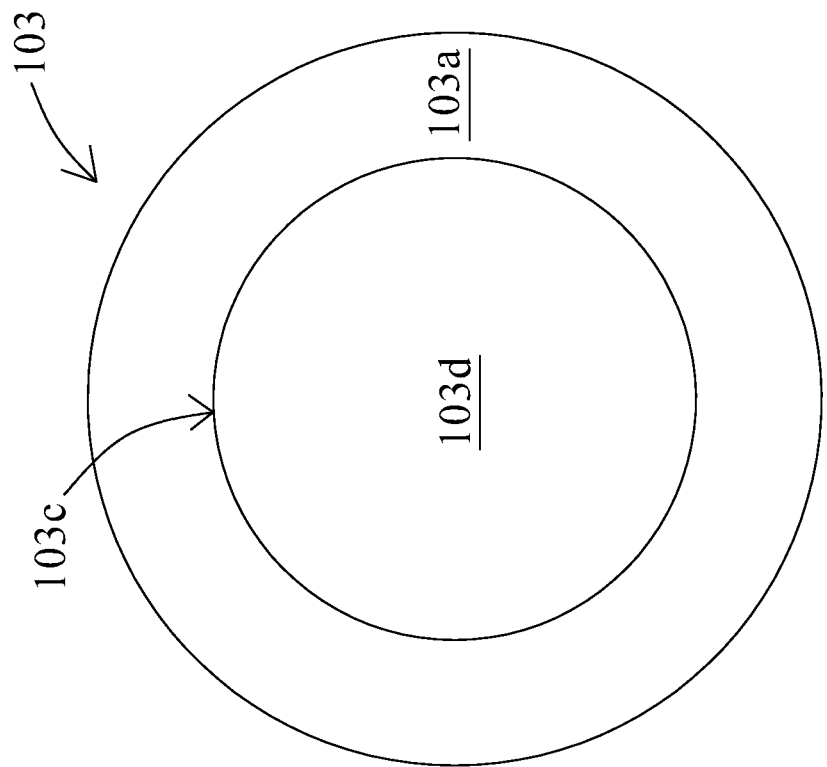

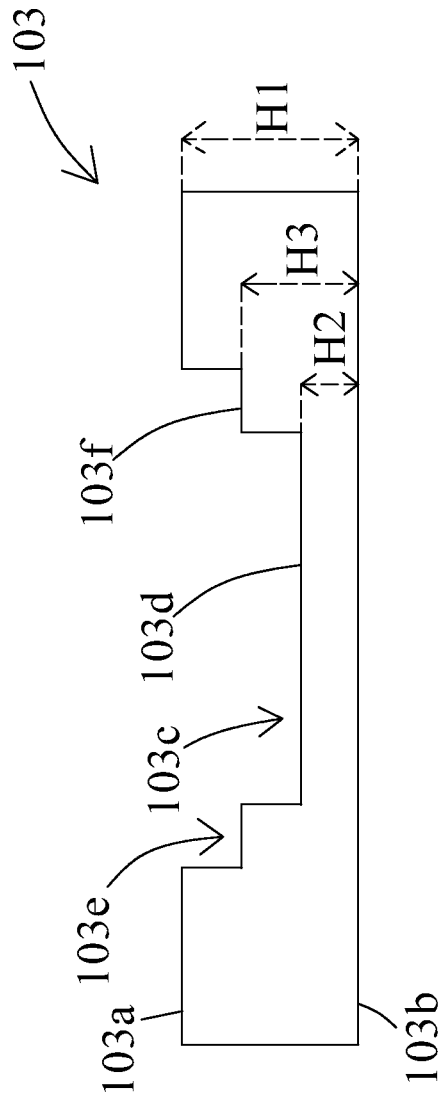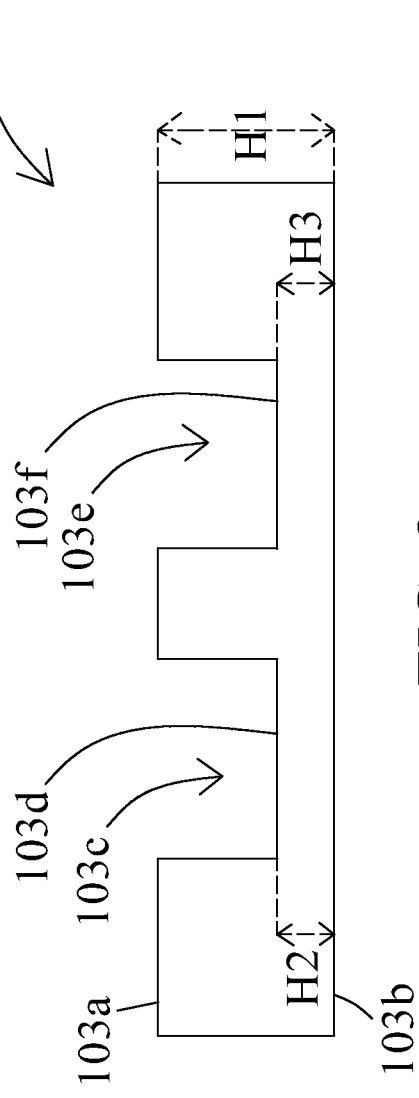
FIG. 7
FIG. 8

METHOD OF MANUFACTURING SEMICONDUCTOR STRUCTURE

PRIORITY CLAIM AND CROSS-REFERENCE

This application is a continuation of U.S. patent application Ser. No. 16/548,867 filed on Aug. 23, 2019, the disclosure of which is hereby incorporated by reference in its entirety.

BACKGROUND

The semiconductor industry has experienced exponential growth, and a semiconductor device fabricated with integrated circuits (ICs) thereon is used in a wide variety of applications. The semiconductor device is typically manufactured by automated or semi-automated equipments. Workpieces, such as substrates or wafers, are loaded into the equipment, and then several electrical components and circuitries are fabricated over or within the workpieces through numerous manufacturing operations.

Upon fabrication of the semiconductor device, photolithography is used to transfer an image of a circuitry pattern to the workpiece. Typically, the photolithography includes a coating process for coating the workpiece with photoresist material, an exposure process for aligning the workpiece with a mask hearing the circuitry pattern and directing a suitable electromagnetic radiation such as ultraviolet (UV) light through or reflected by the mask and onto the photoresist layer, and a developing process for developing the exposed portion of the photoresist layer to remove select (either exposed or non-exposed) portions of the photoresist layer and pattern the photoresist layer.

Since more different small components are involved, a complexity of the manufacturing operations of the semiconductor device is increased. As such, there is a continuous need to modify and improve the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a schematic top cross-sectional view of an embodiment of a plate of the apparatus.

FIG. 3 is a schematic top cross-sectional view of another embodiment of a plate of the apparatus.

FIG. 7 is a schematic cross-sectional view of another embodiment of a plate of the apparatus.

FIG. 8 is a schematic cross-sectional view of another embodiment of a plate of the apparatus.

DETAILED DESCRIPTION OF THE DISCLOSURE

Figure 1:
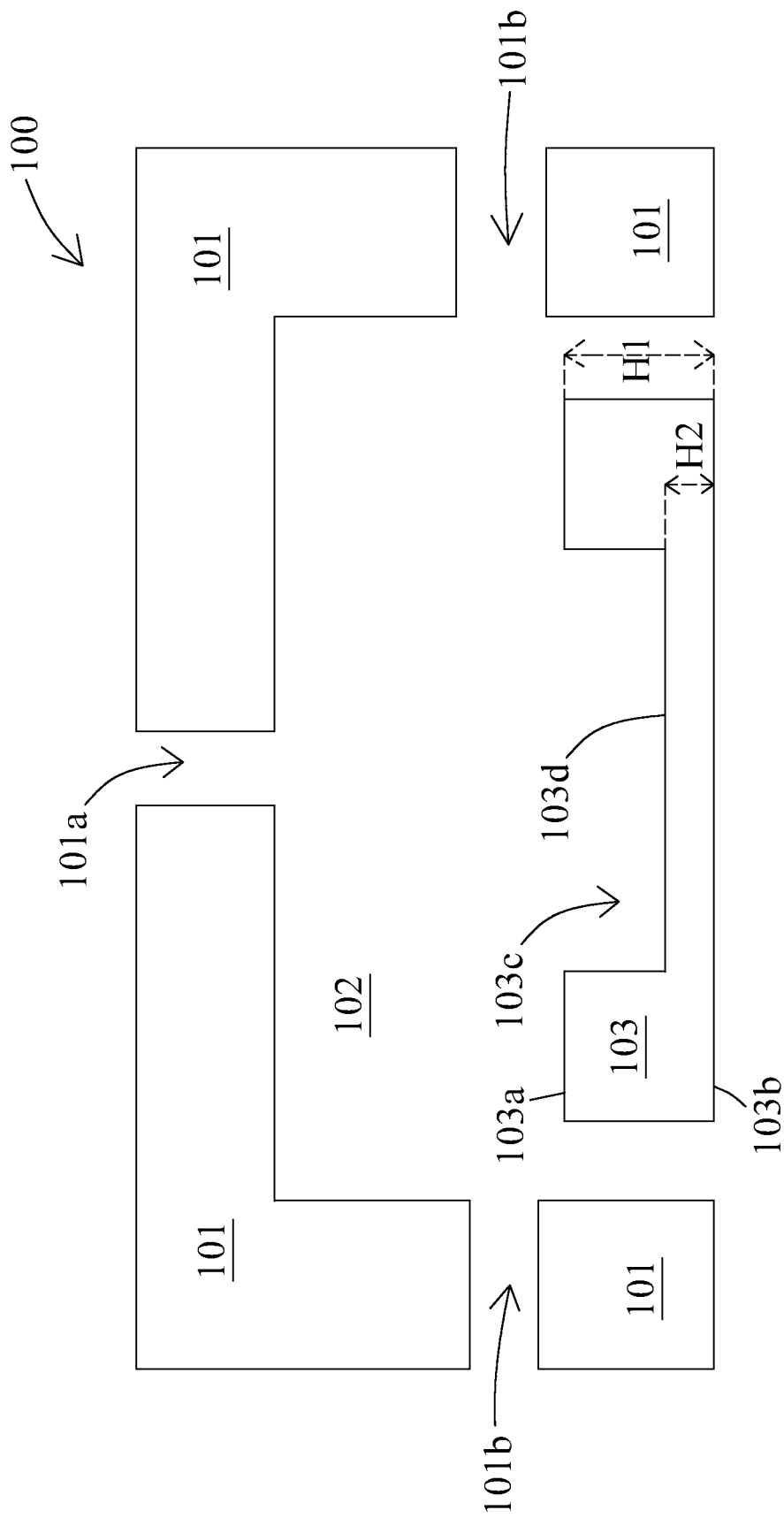
FIG. 1 is a schematic cross-sectional view of an apparatus for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photolithography is used to transfer an image of a circuitry pattern to a semiconductor structure. The photolithography includes a priming process for coating a priming material such as HMDS over the semiconductor structure, and a baking process for removing moisture or an organic solvent from the semiconductor structure before the photoresist coating process. The priming process is implemented prior to a photoresist coating process to improve an adhesion of a photoresist to the semiconductor structure. The priming process includes disposing the priming material over a surface of the semiconductor structure upon rotation of the semiconductor structure at a high speed. After the priming process, a photoresist is coated over the semiconductor structure, exposed to a predetermined electromagnetic radiation, and then developed to become a photoresist pattern corresponding to the circuitry pattern subsequently formed over the semiconductor structure.

However, some unwanted particles are formed during the priming process. Those unwanted particles are adhered to an edge of a backside of the semiconductor structure and thus contaminate the backside of the semiconductor structure. The present of the unwanted particles would adversely affect the subsequent exposure of the photoresist and the development of the photoresist pattern over the semiconductor structure. Defocus may occur during the exposure process, and the photoresist pattern may have overlay distortion issue. These defects often occur at the edge of the backside of the semiconductor structure. As such a reliability of the semiconductor structure may be adversely affected.

In the present disclosure, a method of manufacturing a semiconductor structure is disclosed. The method includes providing a first plate including a first surface, a second surface opposite to the first surface, and a first recess indented from the first surface towards the second surface; providing a semiconductor structure including a third surface, a fourth surface (backside) opposite to the third surface, and a first sidewall extending between the third surface and the fourth surface; placing the semiconductor structure over the first plate; and disposing a priming material over the third surface of the semiconductor structure, wherein a peripheral portion of the fourth surface of the semiconductor structure is in contact with the first surface of the first plate upon the disposing of the priming material.

Since at least a portion of the peripheral portion of the backside of the semiconductor structure is in contact with the plate, unwanted particles formed at or adhered to the peripheral portion of the backside of the semiconductor structure can be reduced or prevented. Furthermore, the contact of the peripheral portion of the backside of the semiconductor structure and the plate can result in blocking the unwanted material. Therefore, the unwanted material formed at or adhered to a central portion of the backside of the semiconductor structure can also be reduced or prevented. As a result, contamination of the backside of the semiconductor structure by the unwanted particles can be reduced or prevented.

Further, another method of manufacturing a semiconductor structure is disclosed. The method includes providing a plate including a first surface, a second surface opposite to the first surface; providing a semiconductor structure including a third surface, a fourth surface opposite to the third surface; placing the semiconductor structure over the plate; disposing a priming material over the third surface of the semiconductor structure; providing a heating source disposed above the plate and the semiconductor structure; and heating the semiconductor structure by the heating source. Since the heating source is separated from (rather than integrated with) the plate, the backside of the semiconductor structure would not be damaged by the heating even the backside of the semiconductor structure largely or entirely contacts the plate upon the heating.

FIG. 1 is a schematic cross-sectional view of an apparatus 100 for manufacturing a semiconductor structure in accordance with various embodiments of the present disclosure. In some embodiments, the apparatus 100 is configured to implement a priming operation for a semiconductor structure. In some embodiments, the apparatus 100 includes a housing 101, a chamber 102 defined by the housing 101, and a first plate 103 configured to support a semiconductor structure thereon and disposed within the chamber 102.

In some embodiments, the apparatus 100 is a priming apparatus configured for coating a priming material over a semiconductor structure. In some embodiments, the priming material is an adhesion promoter or a primer. In some embodiments, the priming material includes hexamethyldisilazane (HMDS) or any other suitable adhesion promoting material. The priming material can promote an adhesion between a semiconductor structure and a photoresist subsequently disposed over the semiconductor structure.

In some embodiments, the housing 101 includes a first passage 101a and a second passage 101b. In some embodiments, the first passage 101a is disposed above the first plate 103. In some embodiments, the first passage 101a is vertically aligned with a center of the first plate 103. In some embodiments, the first passage 101a is configured to allow the priming material flowing into the chamber 102 and towards the first plate 103. In some embodiments, the priming material is in a vapor or gaseous state when flowing into the chamber 102. In some embodiments, an inert gas such as nitrogen together with the priming material are flowed into the chamber 102 through the first passage 101a. In some embodiments, the priming material is flowed into the chamber 102 through the first passage 101a and towards the first plate 103.

In some embodiments, the second passage 101b is disposed at or near a periphery of the first plate 103. In some embodiments, the second passage 101b is configured to discharge a gas from the chamber 102. In some embodiments, the inert gas such as nitrogen is flowed into the chamber 102 through the first passage 101a and then discharged from the chamber 102 through the second passage 101b.

In some embodiments, the first plate 103 is configured to hold and support a semiconductor structure thereon. In some embodiments, the first plate 103 is rotatable about its center. In some embodiments, a semiconductor structure is held on and rotated by the first plate 103 upon the priming operation. In some embodiments, the priming material is flowed into the chamber 102 through the first passage 101a and is disposed a semiconductor structure held on the first plate 103. In some embodiments, the priming material is disposed over a semiconductor structure upon rotation of the first plate 103 and the semiconductor structure.

In some embodiments, the first plate 103 is made of metal or metal alloy. In some embodiments, the first plate 103 includes stainless steel, copper or any other suitable metallic material. In some embodiments, the first plate 103 has a high inciting point (i.e. substantially greater than 450° C.). In some embodiments, the first plate 103 includes a first surface 103a, a second surface 103b opposite to the first surface 103a, and a first recess 103c indented from the first surface 103a towards the second surface 103b. In some embodiments, a semiconductor structure is disposed over the first surface 103a of the first plate 103.

In some embodiments, a cross section of the first plate 103 is in a circular, rectangular or polygonal shape. In some embodiments, a cross section of the first plate 103 is in a circular shape as shown in FIG. 2 illustrating a schematic top view of the first plate 103. In some embodiments, a top cross section of the first plate 103 is in a rectangular shape as shown in FIG. 3 illustrating a schematic top view of the first plate 103.

In some embodiments, the first recess 103c is indented into the first plate 103. In some embodiments, the first recess 103c includes a first bottom surface 103d. In some embodiments, the first plate 103 has a first thickness H1 between the first surface 103a and the second surface 103b, and a second thickness H2 between the first bottom surface 103d of the first recess 103c and the second surface 103b. In some embodiments, the first thickness H1 is substantially greater than the second thickness H2. In some embodiments, the first thickness H1 is about several millimeters to about several centimeters. In some embodiments, the second thickness H2 is about several millimeters.

Figure 5:
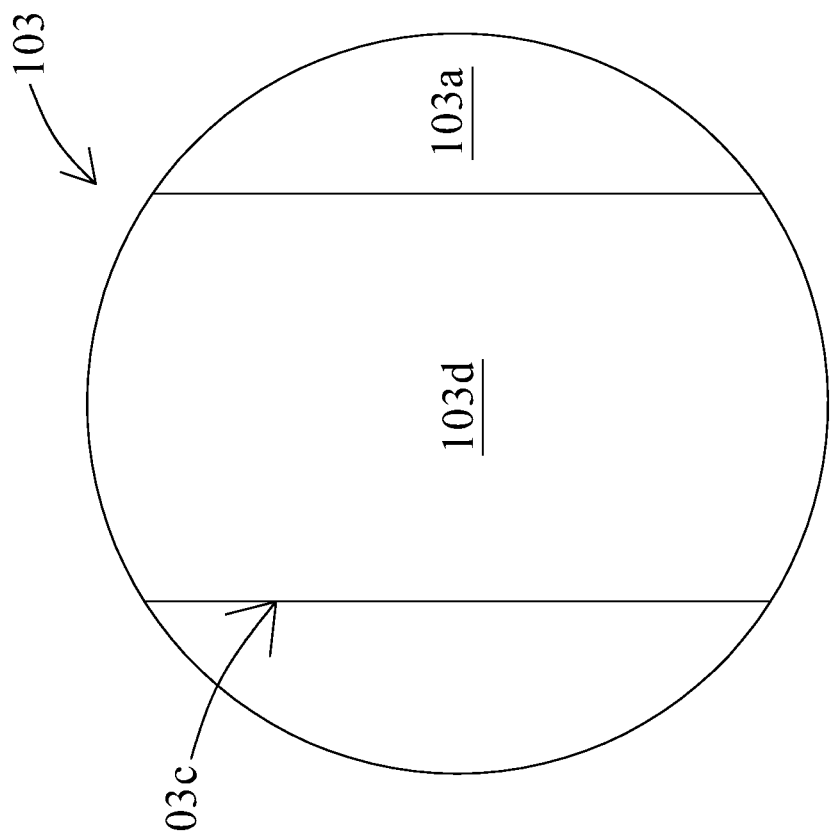
FIG. 5 is a schematic top cross-sectional view of another embodiment of a plate of the apparatus.
Figure 4:
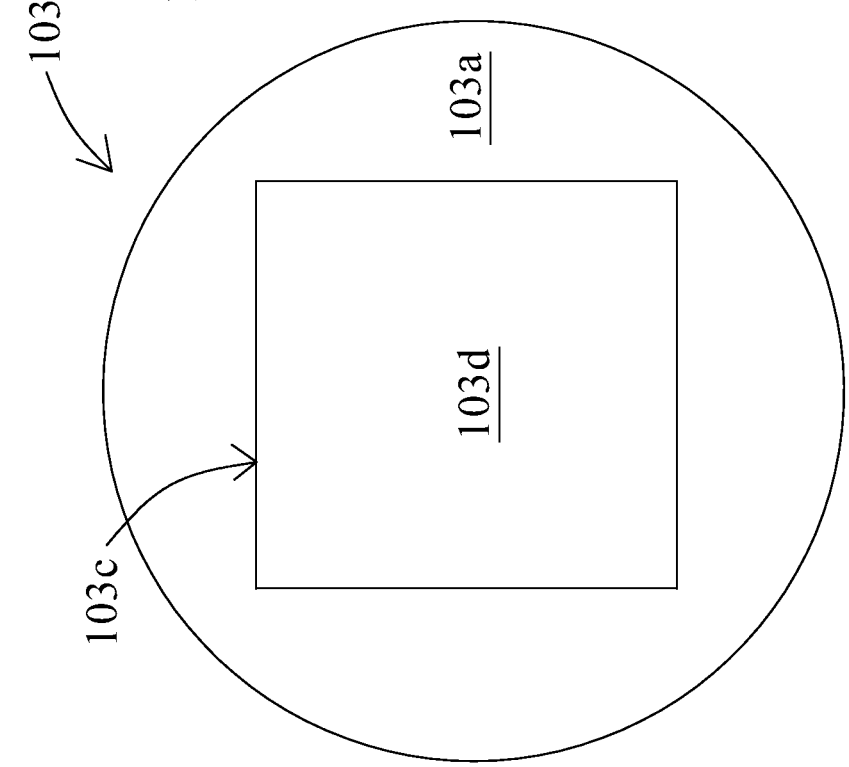
FIG. 4 is a schematic top cross-sectional view of another embodiment of a plate of the apparatus.
Figure 6:
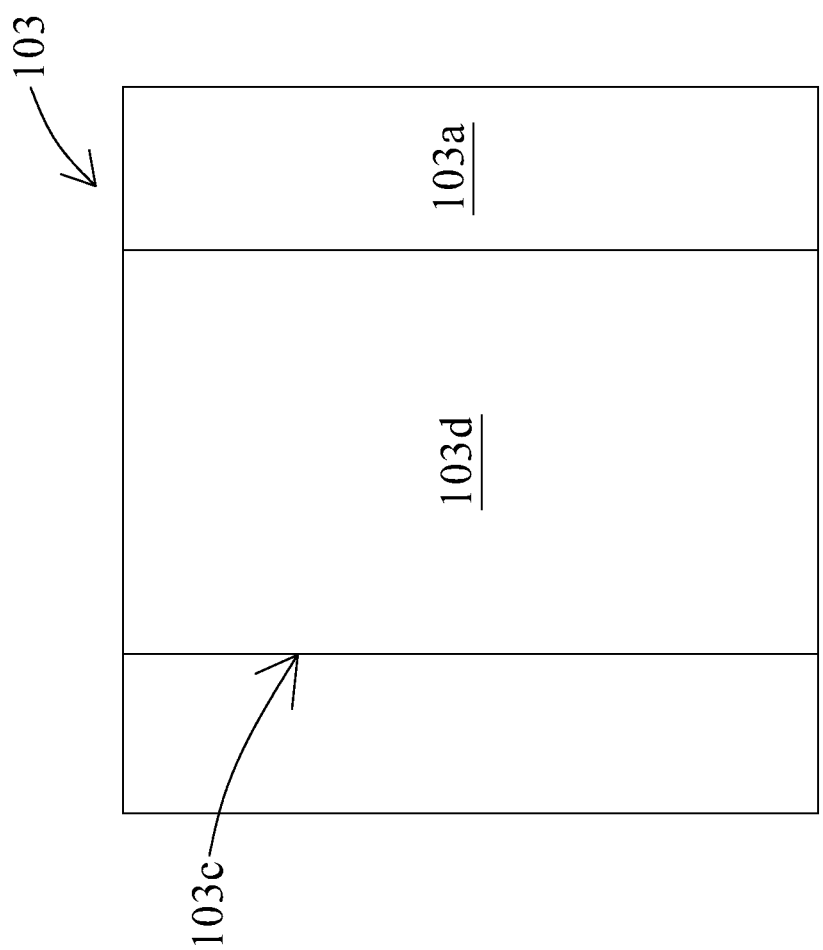
FIG. 6 is a schematic top cross-sectional view of another embodiment of a plate of the apparatus.

In some embodiments, a cross section of the first recess 103c is in a circular, rectangular or polygonal shape. In some embodiments, a top cross section of the first recess 103c is in a circular shape as shown in FIGS. 2 and 3 illustrating a schematic top view of the first recess 103c, In some embodiments, a radius of the first plate 103 is about several inches. In some embodiments, the radius of the first plate 103 is about 5 inches to about 25 inches. In some embodiments, a top cross section of the first recess 103c is in a rectangular shape as shown in FIG. 4 illustrating a schematic top view of the first recess 103c. In some embodiments, a top cross section of the first recess 103c is in a polygonal shape as shown in FIGS. 5 and 6 illustrating a schematic top view of the first recess 103c.

In some embodiments, the first plate 103 further includes a second recess 103e indented into the first plate 103 from the first surface 103a, as shown in FIGS. 7 and 8. In some embodiments as shown in FIG. 7, the second recess 103e is disposed above the first recess 103c. In some embodiments, the second recess 103e includes a second bottom surface 103f. In some embodiments, the first plate 103 has a third thickness H3 between the second bottom surface 103f of the second recess 103e and the second surface 103b of the first plate 103. In some embodiments, the first thickness H1 is substantially greater than the third thickness H3. In some embodiments, the third thickness H3 is substantially greater than the second thickness H2. In some embodiments, a cross section of the second recess 103e is in a circular, rectangular or polygonal shape. In some embodiments, the cross section of the first recess 103c and the cross section of the second recess 103e are in same or different shape.

In some embodiments as shown in FIG. 8, the second recess 103e is disposed adjacent to the first recess 103c and indented from the first surface 103a towards the second surface 103b. In some embodiments, the second thickness H2 between the first bottom surface 103d and the second surface 103b is substantially same as the third thickness H3 between the second bottom surface 103f and the second surface 103b. In some embodiments, the second thickness H2 is substantially different from the third thickness H3. In some embodiments, the first recess 103c and the second recess 103e are laterally aligned with each other. In some embodiments, the cross section of the first recess 103c and the cross section of the second recess 103e are in same or different shape.

Figure 9:
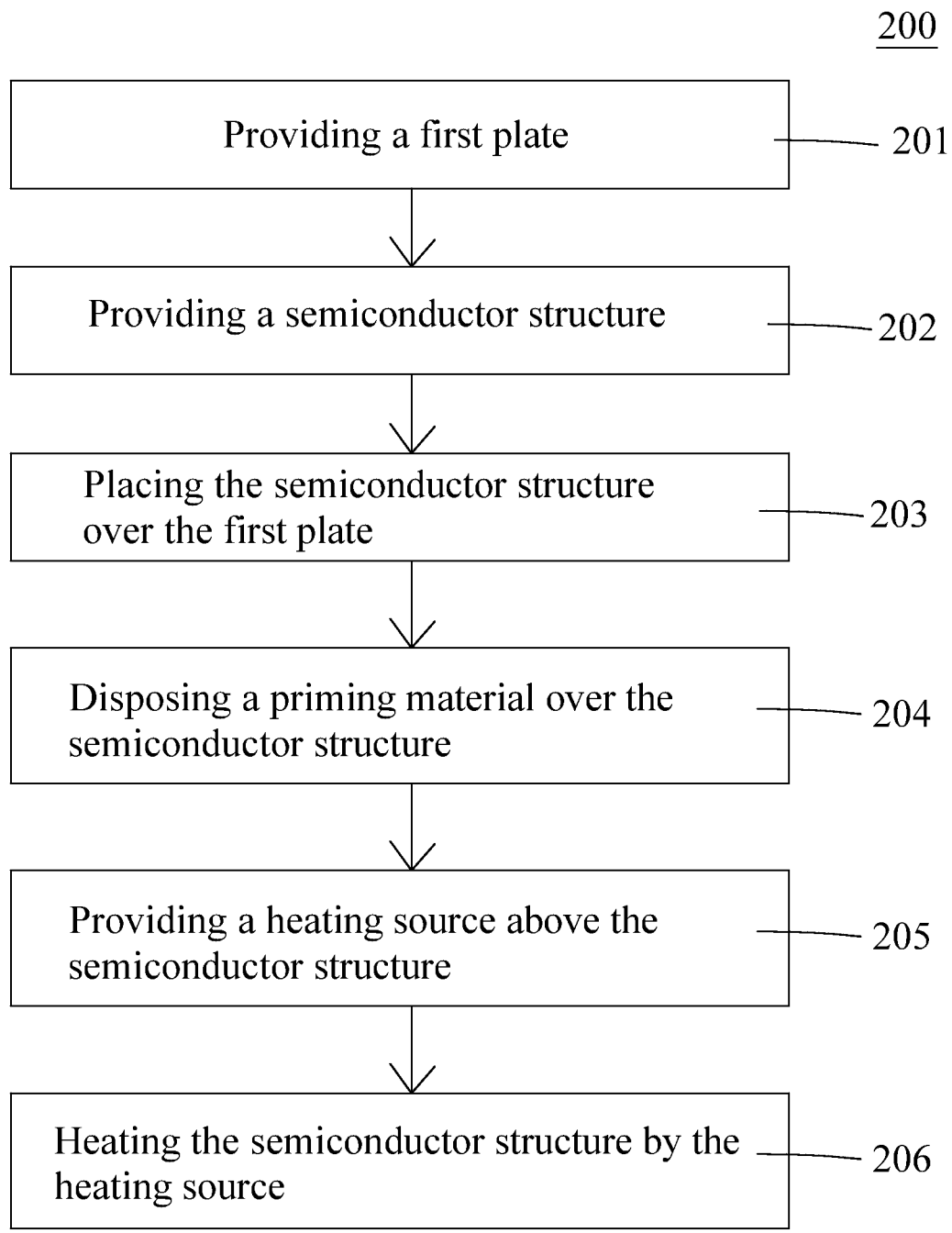
FIG. 9 is a flow diagram of a method of manufacturing a semiconductor structure in accordance with some embodiments of the present disclosure.

In the present disclosure, a method of manufacturing a semiconductor structure is disclosed. A method 200 includes a number of operations and the description and illustration are not deemed as a limitation as the sequence of the operations. FIG. 9 is an embodiment of the method 200 of manufacturing the semiconductor structure. The method 200 includes a number of operations (201, 202, 203, 204, 205 and 206). In some embodiments, the method 200 is implemented by the apparatus 100 as described above or illustrated in FIG. 1.

Figure 10:
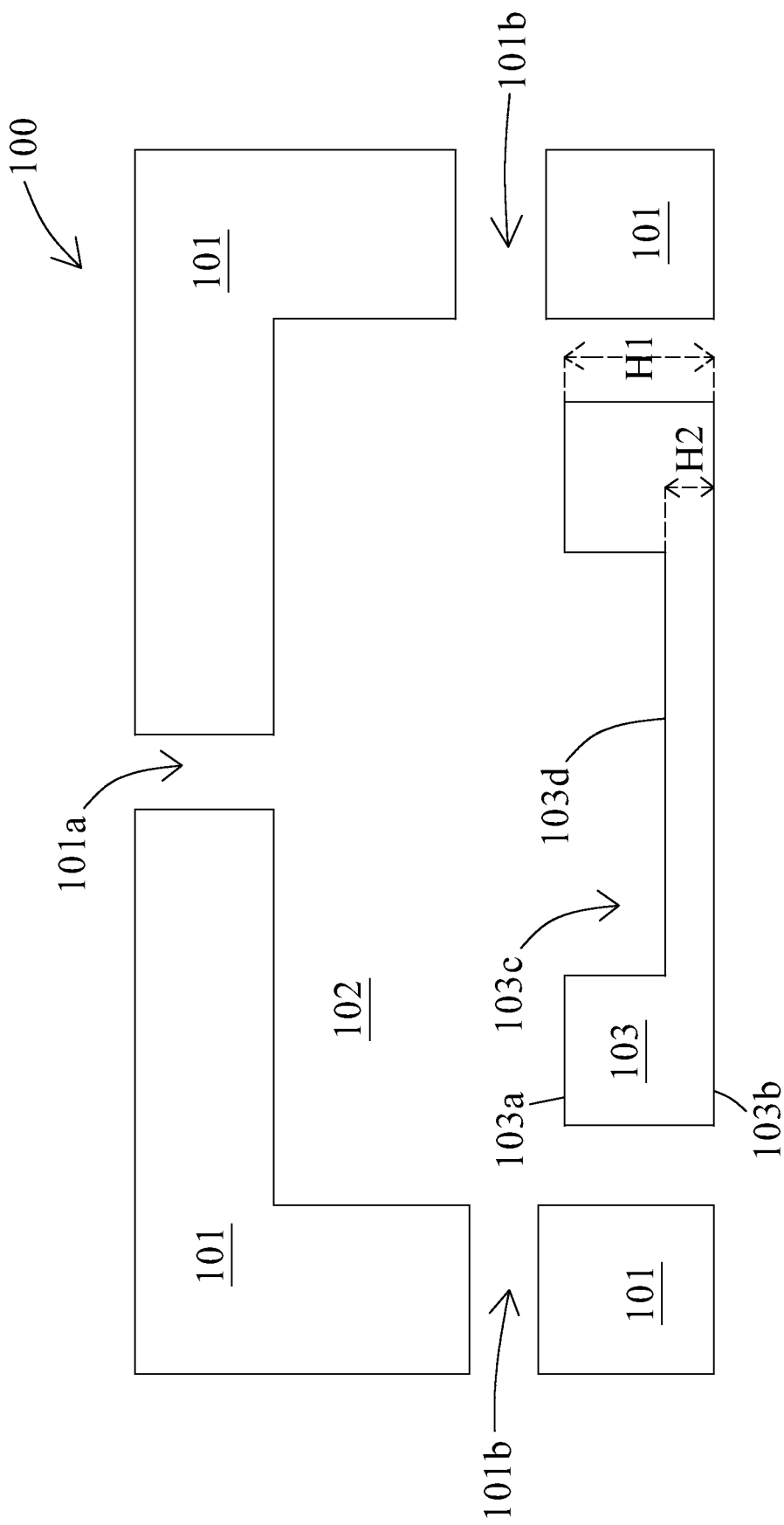
FIGS. 10-27 are schematic views of manufacturing a semiconductor structure by a method of FIG. 9 in accordance with some embodiments of the present disclosure.
Figure 11:
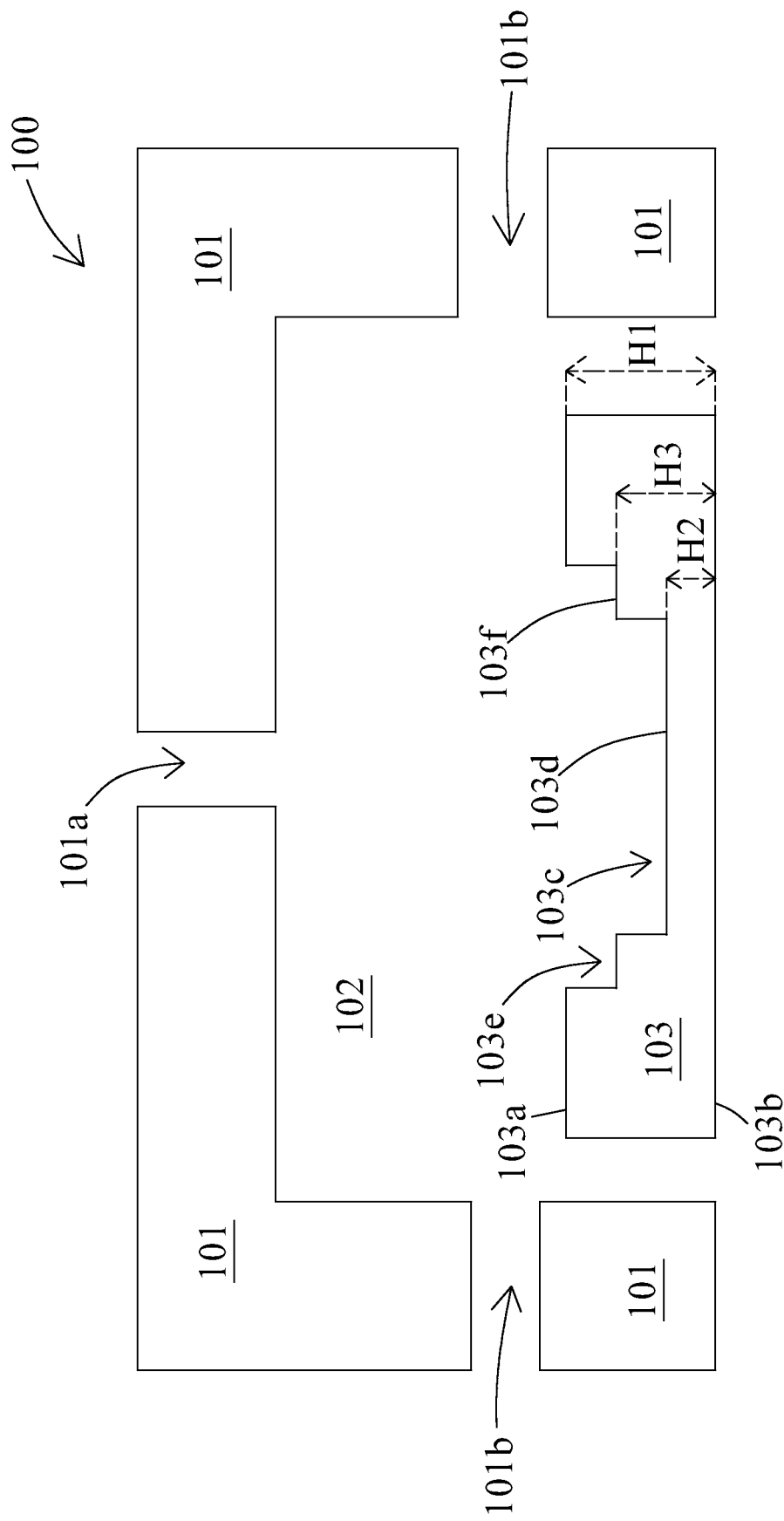
Figure 12:
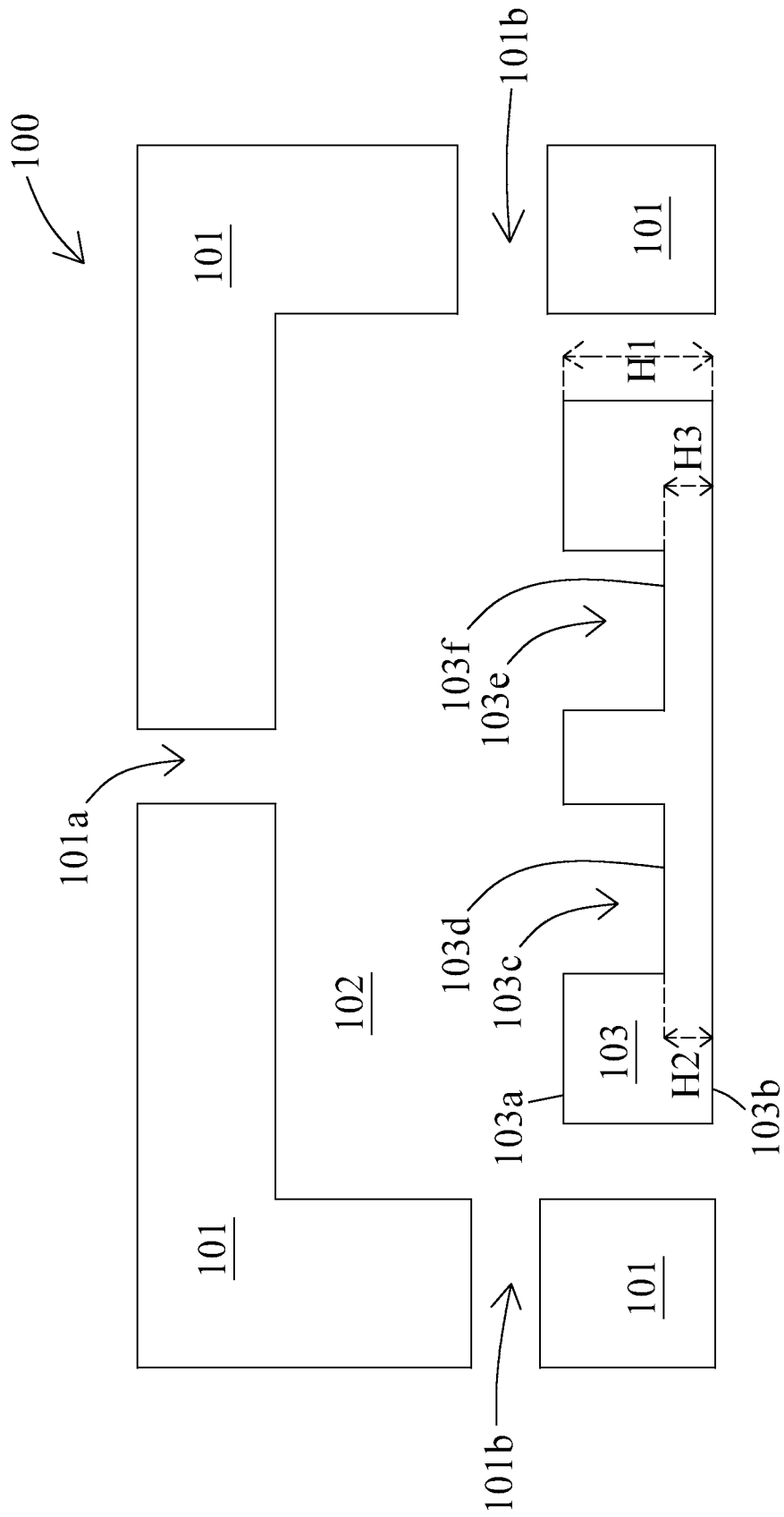

In operation 201, a first plate 103 is provided as shown in FIGS. 10-12. In some embodiments, the first plate 103 is surrounded by a housing 101 and disposed within a chamber 102 of the apparatus 100. In some embodiments, the first plate 103 is configured to hold and support a semiconductor structure. In some embodiments, the first plate 103 is rotatable. In some embodiments, the first plate 103 is rotatable about its center.

In some embodiments as shown in FIG. 10, the first plate 103 as described above or illustrated in FIG. 1 is used. In some embodiments, the first plate 103 includes a first surface 103a, a second surface 103b opposite to the first surface 103a, and a first recess 103c indented from the first surface 103a towards the second surface 103b. In some embodiments, a first thickness H1 of the first plate 103 between the first surface 103a and the second surface 103b is substantially greater than a second thickness H2 of the first plate 103 between a first bottom surface 103d of the first recess 103c and the second surface 103b of the first plate 103. In some embodiments, the first plate 103 is in configuration as described above or illustrated in FIGS. 1-6.

In some embodiments as shown in FIG. 11, the first plate 103 as described above or illustrated in FIG. 7 is used. In some embodiments, the first plate 103 further includes a second recess 103e indented into the first plate 103 from the first surface 103a of the first plate 103. In some embodiments as shown in FIG. 7, the second recess 103e is disposed above the first recess 103c. In some embodiments, the first plate 103 is in configuration as described above or illustrated in FIG. 7.

In some embodiments as shown in FIG. 12, the first plate 103 as described above or illustrated in FIG. 8 is used. In some embodiments, the second recess 103e is disposed adjacent to the first recess 103c and indented from the first surface 103a towards the second surface 103b. In some embodiments, the first plate 103 is in configuration as described above or illustrated in FIG. 8.

Figure 13:
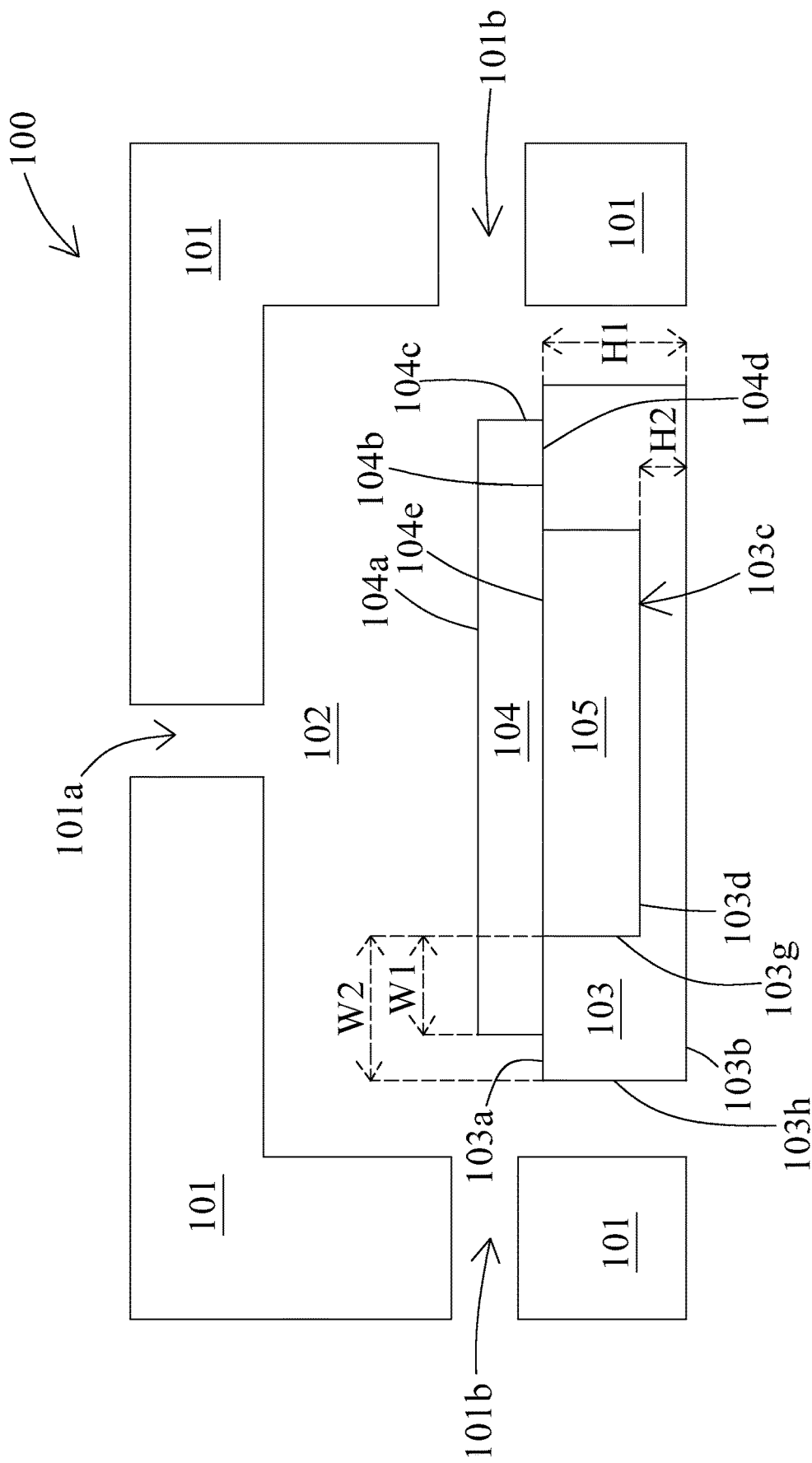
Figure 14:
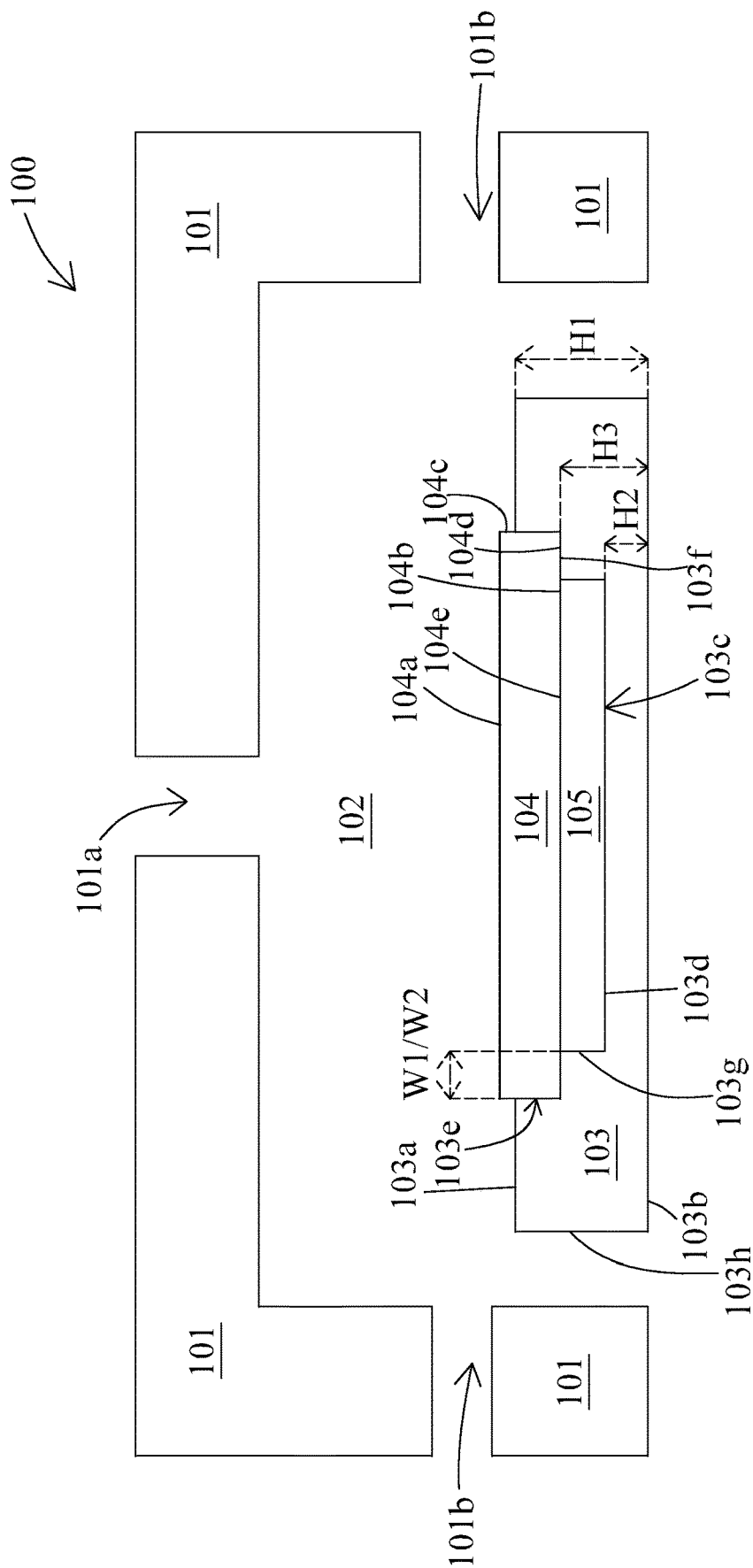
Figure 15:
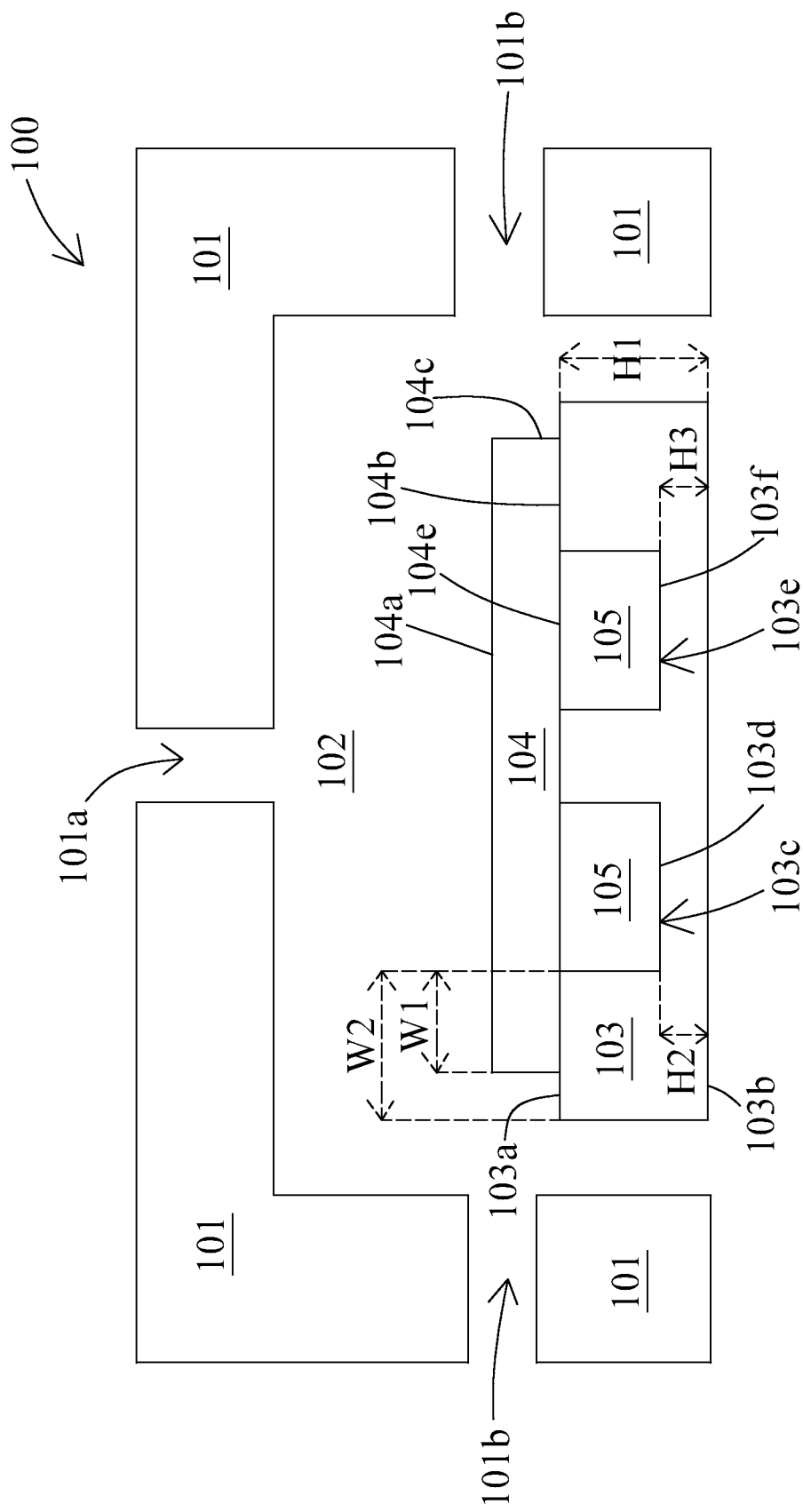

In operation 202, a semiconductor structure 104 is provided as shown in FIGS. 13-15. In some embodiments, the semiconductor structure 104 is a substrate or a wafer. In some embodiments, the semiconductor structure 104 is a substrate, a wafer or the like. In some embodiments, the semiconductor structure 104 includes semiconductive materials such as silicon or other suitable materials. In some embodiments, the semiconductor structure 104 includes electrical components such as transistor disposed thereon.

In some embodiments, the semiconductor structure 104 includes a third surface 104a, a fourth surface 104b opposite to the third surface 104a, and a first sidewall 104c extending between the third surface 104a and the fourth surface 104b. In some embodiments, the third surface 104a is a front side or active side where electrical components or circuitries are disposed thereon. In some embodiments, the fourth surface 104b is a backside or inactive side where no electrical component or circuitry is disposed thereon. In some embodiments, the semiconductor structure 104 is in a circular shape.

In operation 203, the semiconductor structure 104 is placed over the first plate 103 as shown in FIGS. 13-15. In some embodiments as shown in FIG. 13, the semiconductor structure 104 is loaded to the first plate 103 as illustrated in FIG. 10. In some embodiments, the semiconductor structure 104 is disposed on the first surface 103a of the first plate 103. In some embodiments, a peripheral portion 104d of the fourth surface 104b of the semiconductor structure 104 is in contact with the first surface 103a of the first plate 103. In some embodiments, an interface is present between the peripheral portion 104d of the semiconductor structure 104 and the first surface 103a of the first plate 103.

In some embodiments, a first width W1 of the periphery portion 104d of the semiconductor structure 104 contacted with the first surface 103a of the first plate 103 is substantially less than or equal to a second width W2 of the first surface 103a of the first plate 103. In some embodiments, the first sidewall 104c of the semiconductor structure 104 is disposed above the first surface 103a of the first plate 103. In some embodiments, the first width W1 is substantially same as the second width W2, so that the first sidewall 104c is vertically aligned with and substantially coplanar with a third sidewall 103h of the first plate 103. In some embodiments, the difference between the second width W2 and the first width W1 is substantially greater than 1 mm.

In some embodiments, the semiconductor structure 104 is disposed above the first recess 103c, such that a void 105 is present between the semiconductor structure 104 and the first plate 103. In some embodiments, the void 105 is defined by the fourth surface 104b of the semiconductor structure 104, the first bottom surface 103d and a second sidewall 103g of the first recess 103c. In some embodiments, a central portion 104e of the fourth surface 104b of the semiconductor structure 104 is disposed above the first recess 103c of the first plate 103. In some embodiments, the central portion 104e of the fourth surface 104b of the semiconductor structure 104 is surrounded or enclosed by the peripheral portion 104d of the fourth surface 104b of the semiconductor structure 104.

In some embodiments as shown in FIG. 14, the semiconductor structure 104 is loaded to the first plate 103 as illustrated in FIG. 11. In some embodiments, the semiconductor structure 104 is disposed on the first surface 103a of the first plate 103. In some embodiments, the peripheral portion 104d of the fourth surface 104b of the semiconductor structure 104 is in contact with the first surface 103a of the first plate 103. In some embodiments, the first width W1 is substantially same as the second width W2. In some embodiments, the semiconductor structure 104 is disposed above the first recess 103c, such that the void 105 is present between the semiconductor structure 104 and the first plate 103.

In some embodiments, the central portion 104O of the fourth surface 104b of the semiconductor structure 104 is disposed above the first recess 103c of the first plate 103. In some embodiments, the central portion 104e of the fourth surface 104h of the semiconductor structure 104 is surrounded or enclosed by the peripheral portion 104d of the fourth surface 104b of the semiconductor structure 104. In some embodiments, at least a portion of the semiconductor structure 104 is disposed within the second recess 103e. In some embodiments, at least a portion of the semiconductor structure 104 is surrounded by the first plate 103.

In some embodiments, at least a portion of the first sidewall 104c of the semiconductor structure 104 is exposed from the first plate 103. In some embodiments, at least a portion of the first sidewall 104c is disposed within the second recess 103e. In some embodiments, the first sidewall 104c is entirely disposed within the second recess 103e. In some embodiments, at least a portion of the first sidewall 104c of the semiconductor structure 104 is in contact with the first plate 103.

In some embodiments as shown in FIG. 15, the semiconductor structure 104 is loaded to the first plate 103 as illustrated in FIG. 12. In some embodiments, the second recess 103e is disposed adjacent to the first recess 103c and indented from the first surface 103a towards the second surface 103b. In some embodiments, the semiconductor structure 104 is disposed on the first surface 103a of the first plate 103. In some embodiments, the peripheral portion 104d of the fourth surface 104b of the semiconductor structure 104 is in contact with the first surface 103a of the first plate 103. In some embodiments the first width W1 is substantially less than or equal to the second width W2.

In some embodiments, the first sidewall 104c of the semiconductor structure 104 is disposed above the first surface 103a of the first plate 103. In some embodiments, the semiconductor structure 104 is disposed above the first recess 103c and the second recess 103e, such that voids 105 are present between the semiconductor structure 104 and the first plate 103. In some embodiments, central portions 104e of the fourth surface 104b of the semiconductor structure 104 are disposed above the first recess 103c and the second recess 103e, In some embodiments, the central portions 104e are surrounded or enclosed by the peripheral portion 104d of the fourth surface 104b of the semiconductor structure 104.

Figure 16:
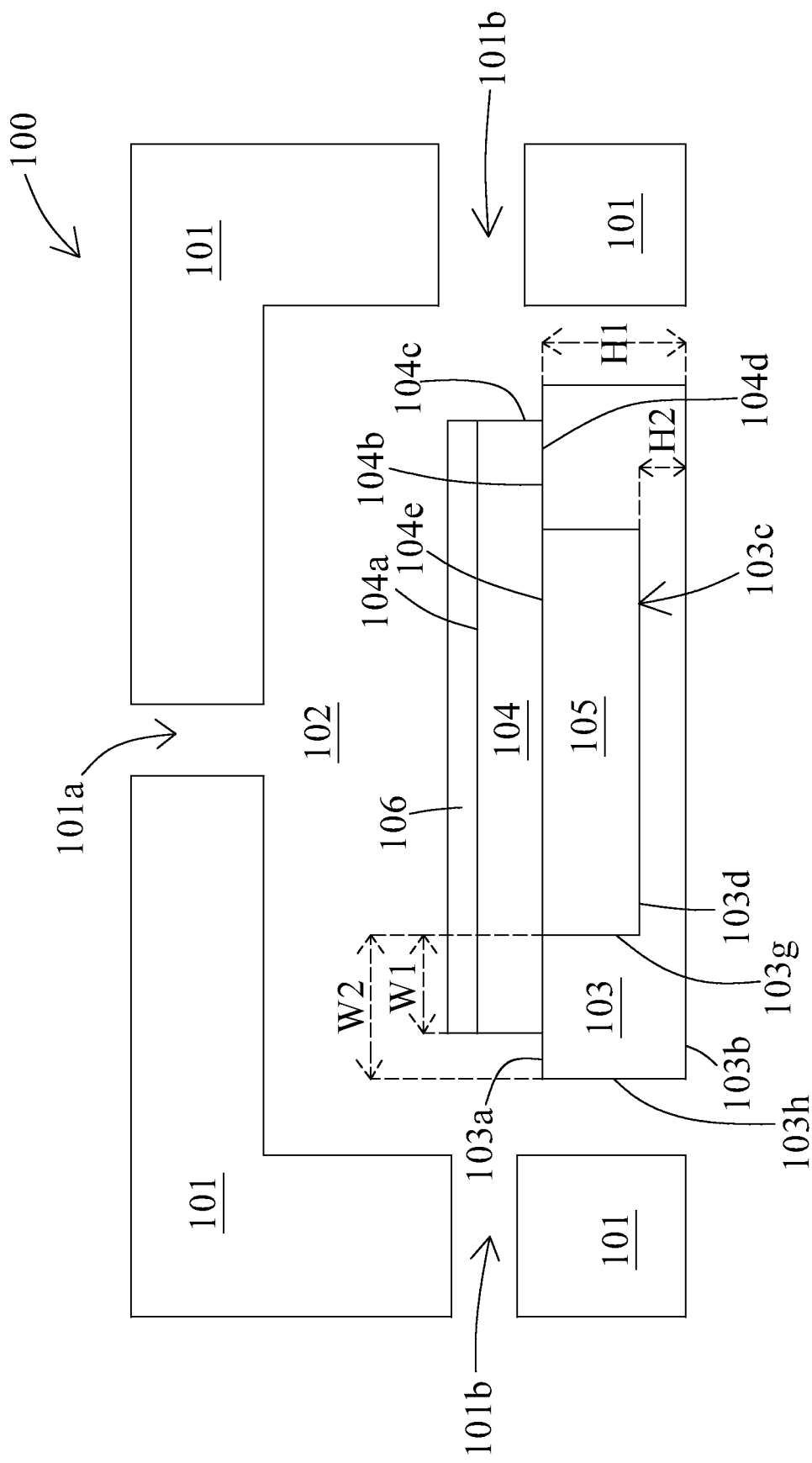
Figure 17:
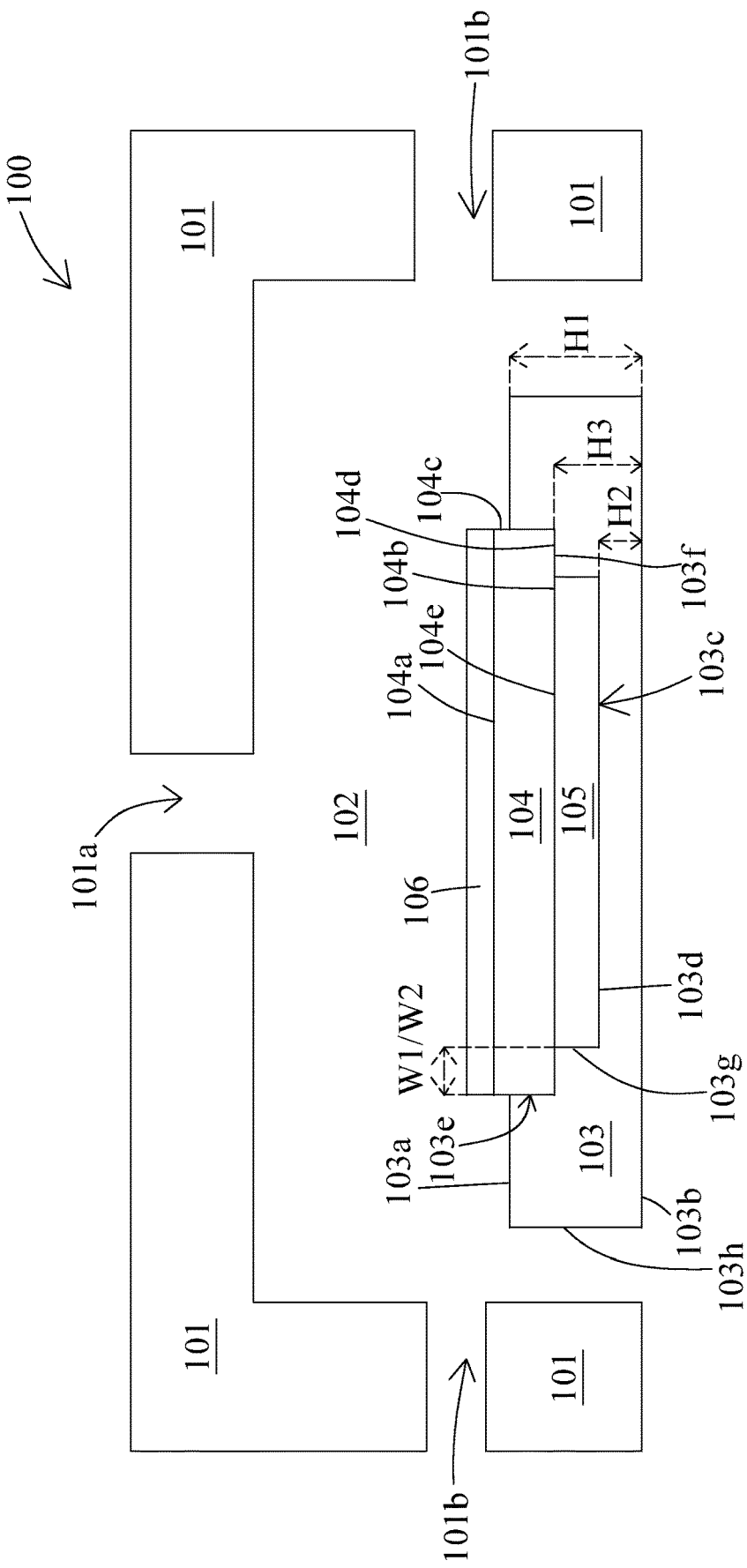
Figure 18:
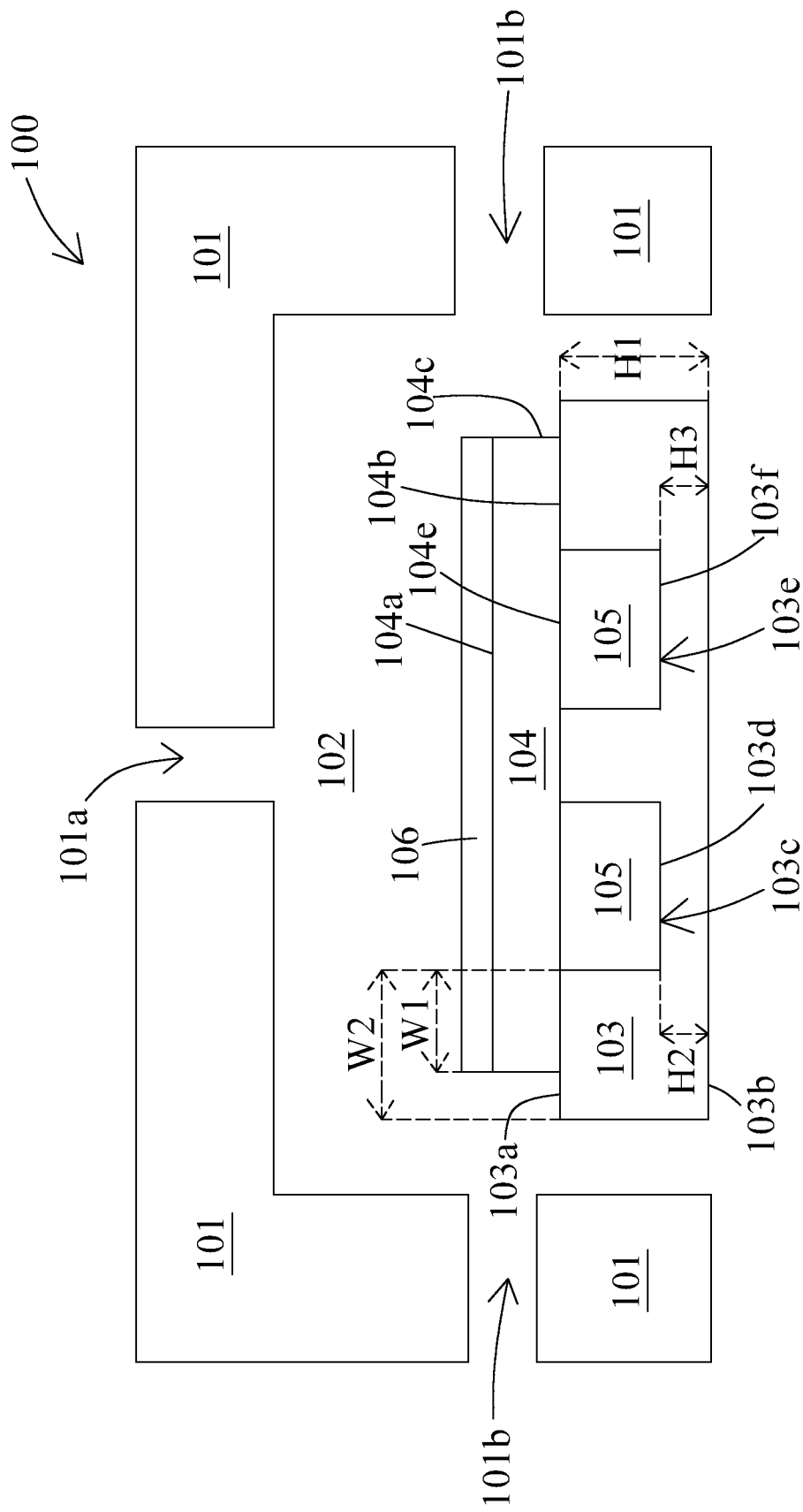

In operation 204, a priming material is disposed over the semiconductor structure 104 as shown in FIGS. 16-18. In some embodiments, the priming material is disposed over the third surface 104a of the semiconductor structure 104 to form a priming layer 106 over the third surface 104a, In some embodiments, the priming layer 106 provides a hydrophobic surface for photoresist subsequently disposed thereon. In some embodiments, the peripheral portion 104d of the semiconductor structure 104 is in contact with the first surface 103a of the first plate 103 upon the disposing of the priming material.

In some embodiments, the priming material is flown into the chamber 102 through the first passage 101a towards the third surface 104a of the semiconductor structure 104. In some embodiments, the priming material is in a vapor or gaseous state upon flowing into the chamber 102. In some embodiments, an inert gas such as nitrogen is also flown into the chamber 102 together with the priming material. In some embodiments, the inert gas is flown out of the chamber 102 through the second passage 101b. In some embodiments, the priming material is disposed over the third surface 104a of the semiconductor structure 104 upon rotation of the first plate 103 about its center. In some embodiments, the priming material is disposed over the semiconductor structure 104 under a room temperature.

In some embodiments, the priming material includes HIV IDS or any other suitable material. In some embodiments, a photoresist is disposed over the priming layer 106 after the disposing of the priming material. In some embodiments, the semiconductor structure 104 is unloaded from the first plate 103 after the disposing of the priming material and the formation of the priming layer 106. In some embodiments, a lifting pin is installed at a bottom of the first plate 103 and is configured to load to or unload from the semiconductor structure 104 the first plate 103. In some embodiments, the lifting pin is protruded from the first bottom surface 103d and in contact with the fourth surface 104b of the semiconductor structure 104 upon loading or unloading of the semiconductor structure 104.

Since the peripheral portion 104d of the semiconductor structure 104 is in contact with the first surface 103a of the first plate 103 upon the disposing of the priming material, the priming material would not be disposed on the fourth surface 104b of the semiconductor structure 104. Further, unwanted material would also not be formed on the fourth surface 104b. There is no contamination over the fourth surface 104b of the semiconductor structure 104. As such, defect (such as defocus, overlay distortion, etc.) in subsequent photoresist exposure operation and photoresist development operation would be mitigated or prevented.

Figure 19:
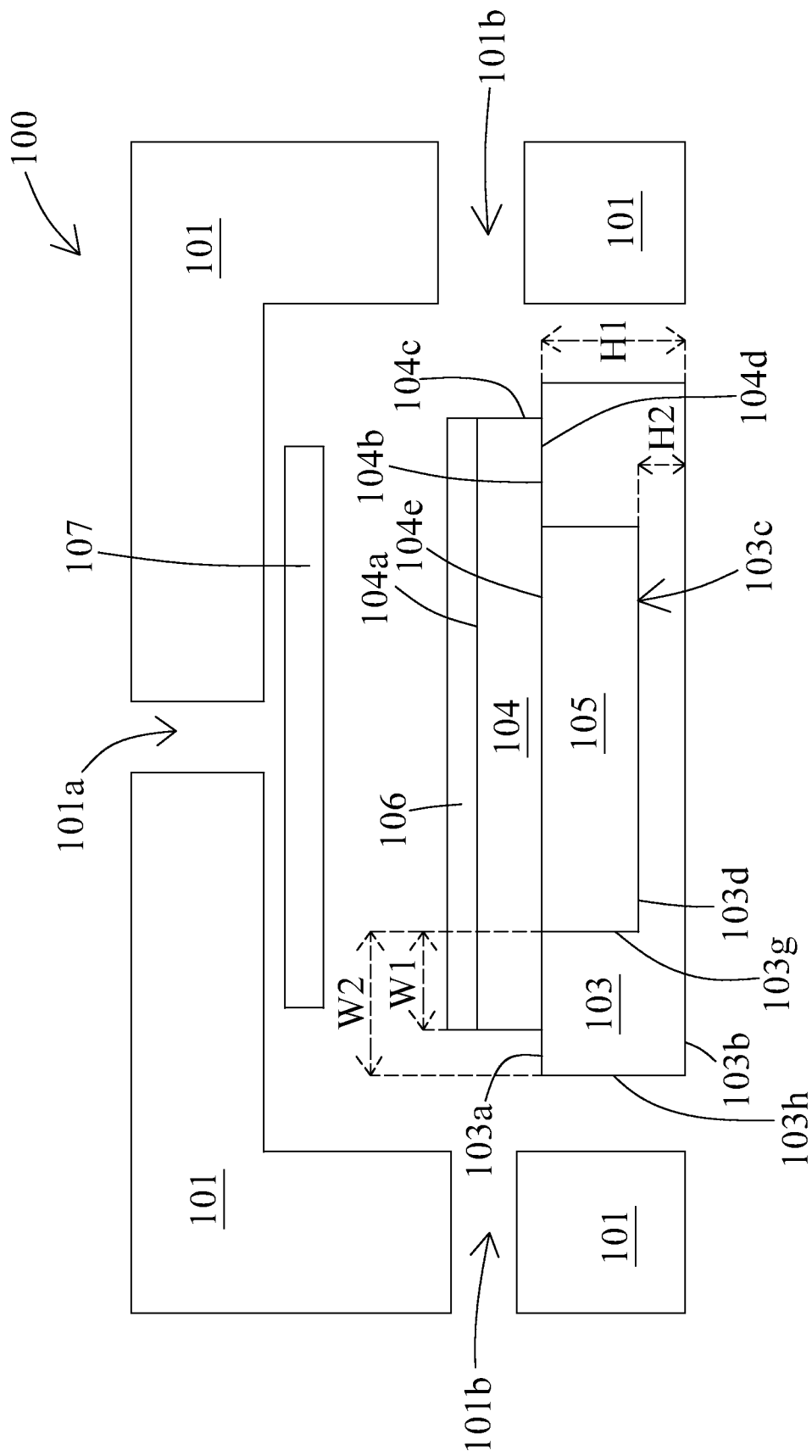
Figure 20:
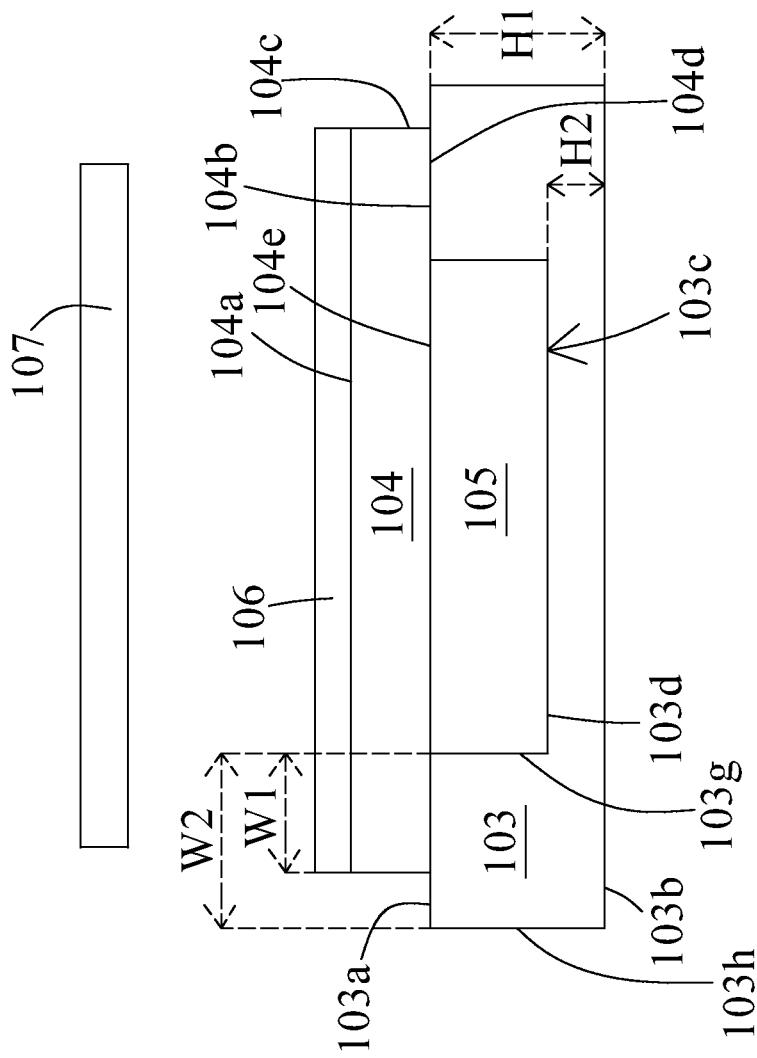
Figure 21:
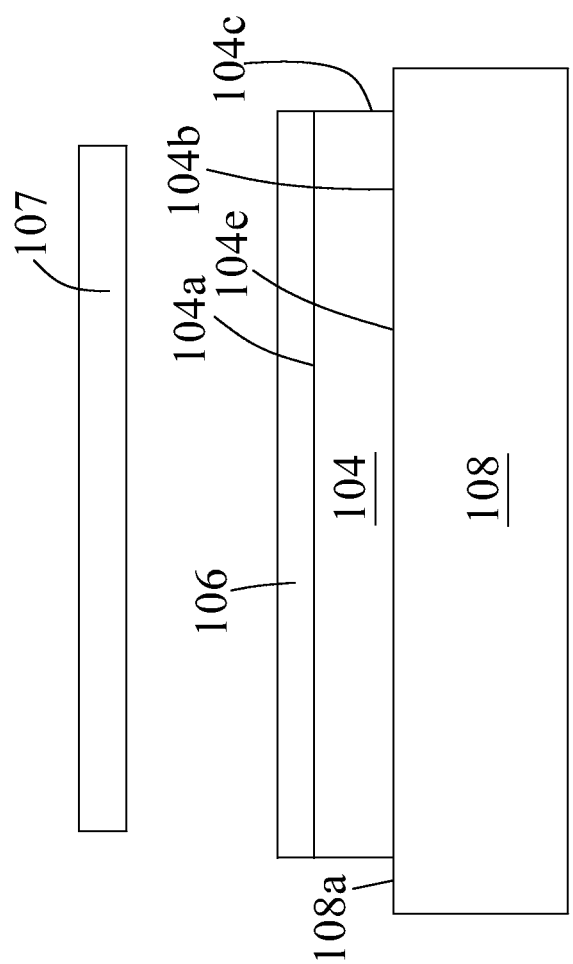

In operation 205, a heating source 107 is provided as shown in FIGS. 19-21. In some embodiments, the heating source 107 is disposed above the semiconductor structure 104 and the first plate 103. In some embodiments, the heating source 107 is disposed above the third surface 104a of the semiconductor structure 104. In some embodiments, the heating source 107 is disposed above the priming layer 106. In some embodiments, the heating source 107 is separated from the first plate 103. In some embodiments, a distance D between the heating source 107 and the third surface 104a of the semiconductor structure 104 is substantially greater than 1 um.

In some embodiments, the heating source 107 is disposed above the priming layer 106 after the disposing of the priming material. In some embodiments, the heating source 107 is configured to emit a predetermined electromagnetic radiation. In some embodiments, the predetermined electromagnetic radiation includes ultra-violet (UV), infra-red (IR) or an electromagnetic radiation with a wavelength of substantially greater than 365 nm. In some embodiments, the heating source is a halogen lamp, quartz tub, LED lamp or the like.

FIGS. 19-20 only illustrate the heating source 107 is disposed above the first plate 103 as shown in FIG. 16, however, it is understood that the heating source 107 can also be disposed above the first plate 103 as shown in FIGS. 17 and 18 in similar manner. In some embodiments as shown in FIG. 19, the heating source 107 is provided inside the chamber 102. In some embodiments as shown in FIG. 20, the semiconductor structure 104 is removed from the chamber 102 of the apparatus 100 prior to the provision of the heating source 107, and thus the heating source 107 is provided outside the chamber 102.

In some embodiments as shown in FIG. 21, a second plate 108 is provided, and the semiconductor structure 104 coated with the priming layer 106 is unloaded from the first plate 103, and then loaded to the second plate 108. In some embodiments, the semiconductor structure 104 is removed from the chamber 102 after the disposing of the priming material. In some embodiments, the second plate 108 is configured to hold and support the semiconductor structure 104. In some embodiments, the second plate 108 includes a fifth surface 108a, and the fourth surface 104b of the semiconductor structure 104 is entirely in contact with the fifth surface 108a of the second plate 108 after the loading of the semiconductor structure 104 to the second plate 108. In some embodiments, the heating source 107 is disposed above the second plate 108.

In operation 206, the semiconductor structure 104 is heated by the heating source 107 as shown in FIGS. 19-21. In some embodiments, the semiconductor structure 104 is disposed over the first plate 103 upon the disposing of the priming material, while the semiconductor structure 104 is disposed over the second plate 108 upon the heating. In some embodiments, the heating source 107 emits the predetermined electromagnetic radiation to increase a temperature of the semiconductor structure 104 coated with the priming layer 106. In some embodiments, temperatures of the first plate 103 and the priming layer 106 are also increased by the heating.

In some embodiments, the semiconductor structure 104, the priming layer 106 or the first plate 103 is increased to the temperature of about 70° C. to about 120° C. In some embodiments, the temperature is about 150° C. to about 250° C. In some embodiments, the temperature is about 60° C. to about 450° C. In some embodiments, the temperature is substantially greater than a room temperature. In some embodiments, a photoresist is disposed over the priming layer 106 after the heating.

Another embodiment of the method 200 of FIG. 9 is also disclosed. In some embodiments, the method 200 is implemented by the apparatus 100 having a housing 101 and a chamber 102 as described above or illustrated in FIG. 1.

Figure 22:
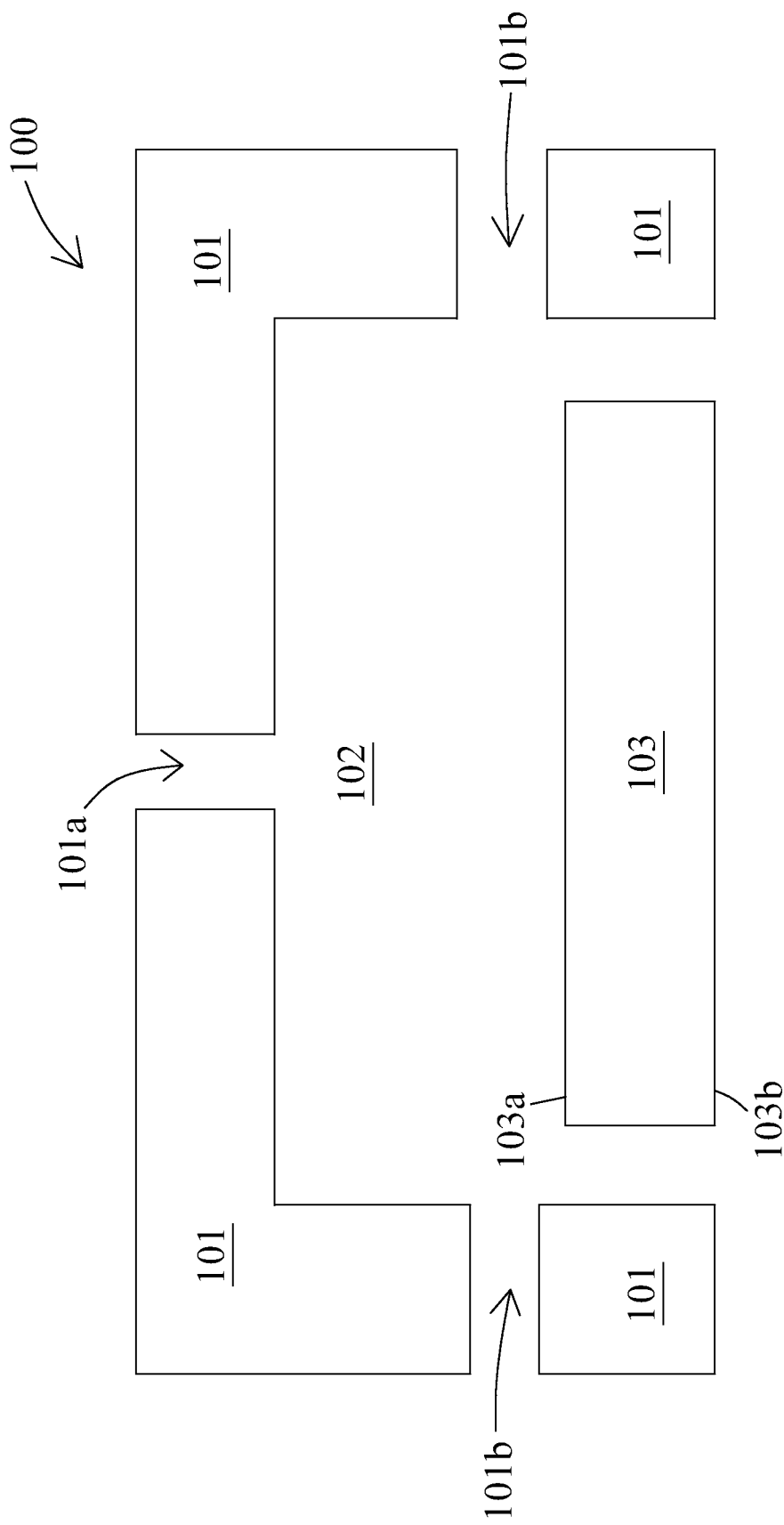

In operation 201, a first plate 103 is provided as shown in FIG. 22. In some embodiments, the first plate 103 is configured to hold and support a semiconductor structure. In some embodiments, the first plate 103 is rotatable. In some embodiments, the first plate 103 is rotatable about its center. In some embodiments, the first plate 103 includes a first surface 103a, a second surface 103b opposite to the first surface 103a. In some embodiments, the first surface 103a is substantially in parallel to the second surface 103b. In some embodiments, the first surface 103a is a flat surface.

Figure 23:
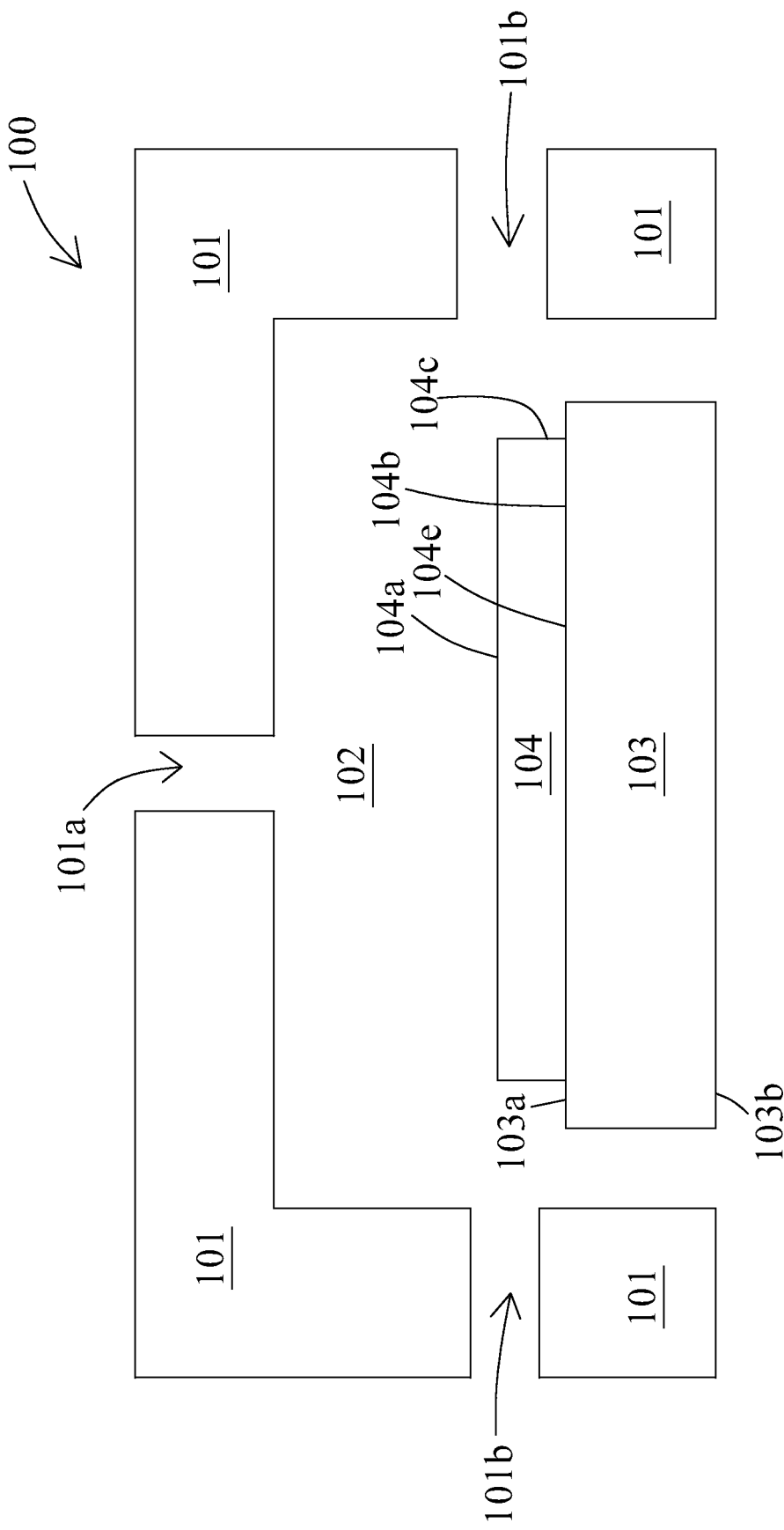

In operation 202, a semiconductor structure 104 is provided as shown in FIG. 23. In some embodiments, the operation 202 is implemented as described above.

In operation 203, the semiconductor structure 104 is placed over the first plate 103 as shown in FIG. 23. In some embodiments, the semiconductor structure 104 is loaded to the first plate 103, so that the fourth surface 104b of the semiconductor structure 104 is disposed on the first surface 103a of the first plate 103. In some embodiments, the fourth surface 104b is entirely in contact with the first surface 103a. In some embodiments, no void is present between the semiconductor structure 104 and the first plate 103.

Figure 24:
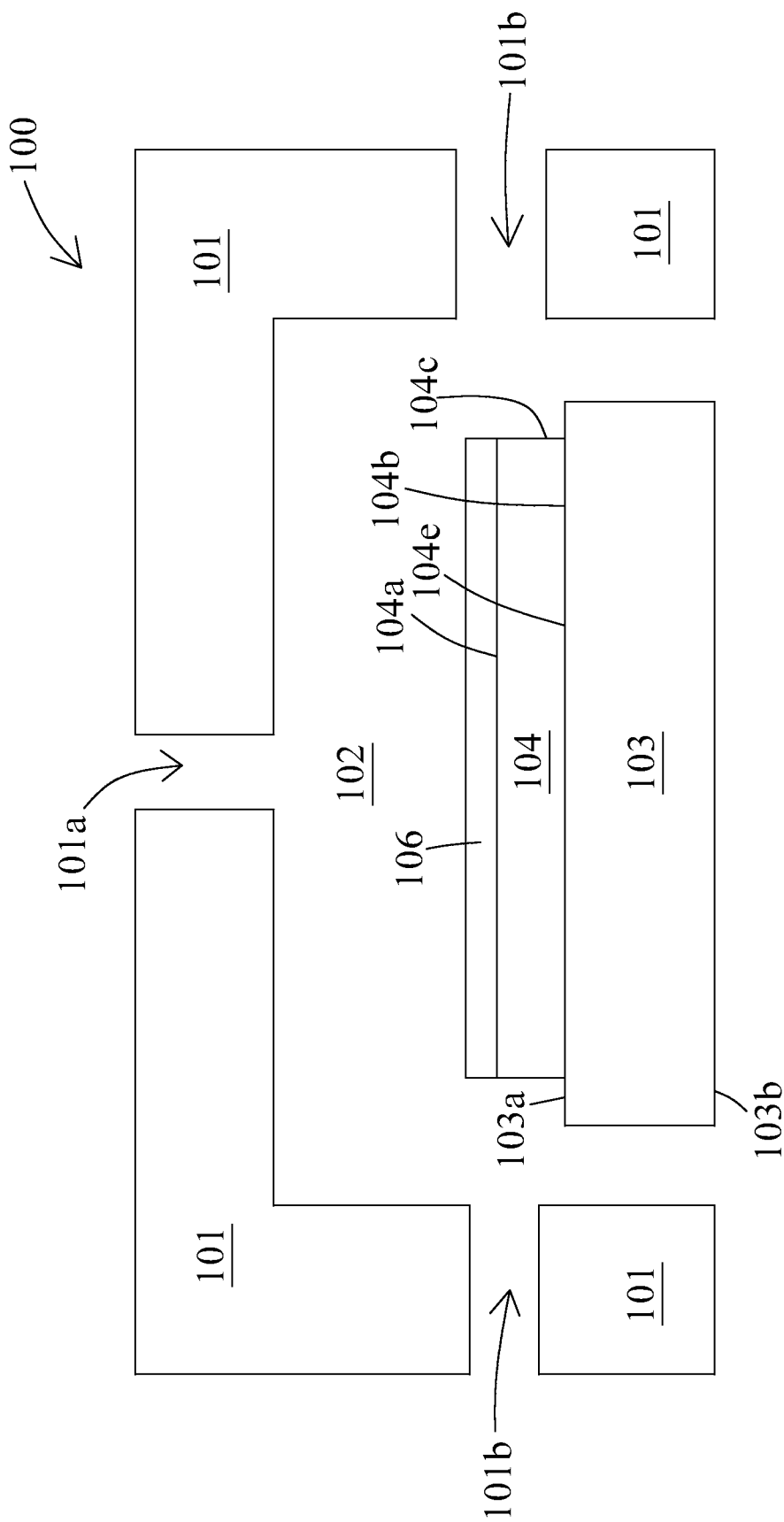

In operation 204, a priming material is disposed over the semiconductor structure 104 as shown in FIG. 24. In some embodiments, the fourth surface 104b of the semiconductor structure 104 is entirely in contact with the first surface 103a of the first plate 103 upon the disposing of the priming material. In some embodiments, the disposing of the priming material is implemented as the operation 204 described above.

Figure 25:
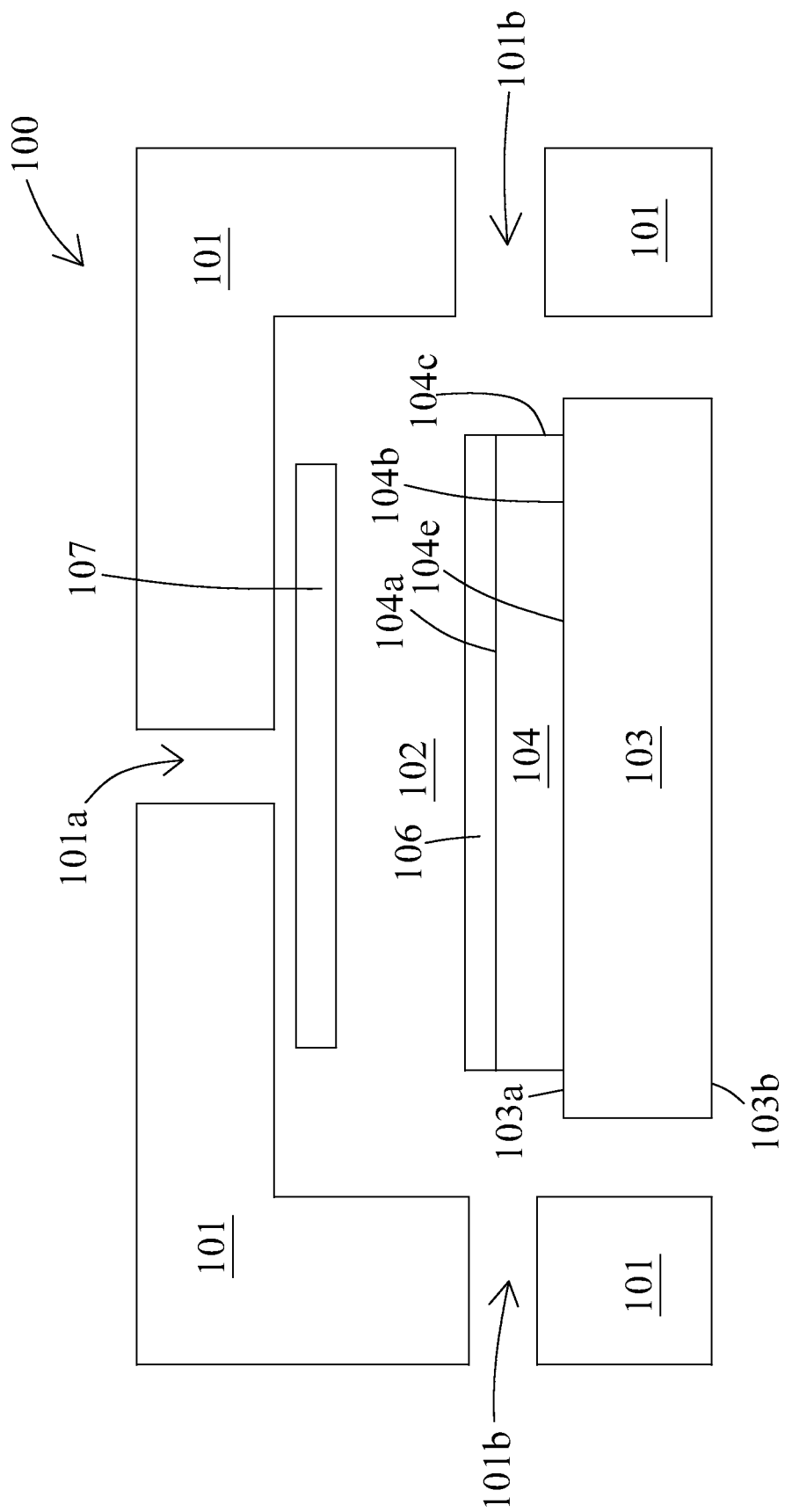
Figure 26:
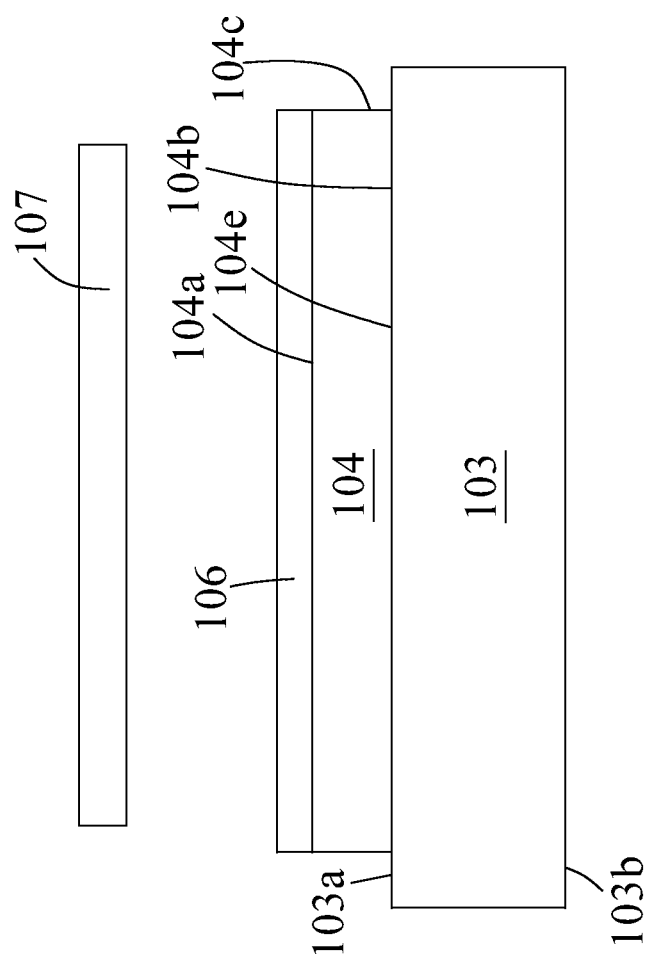
Figure 27:
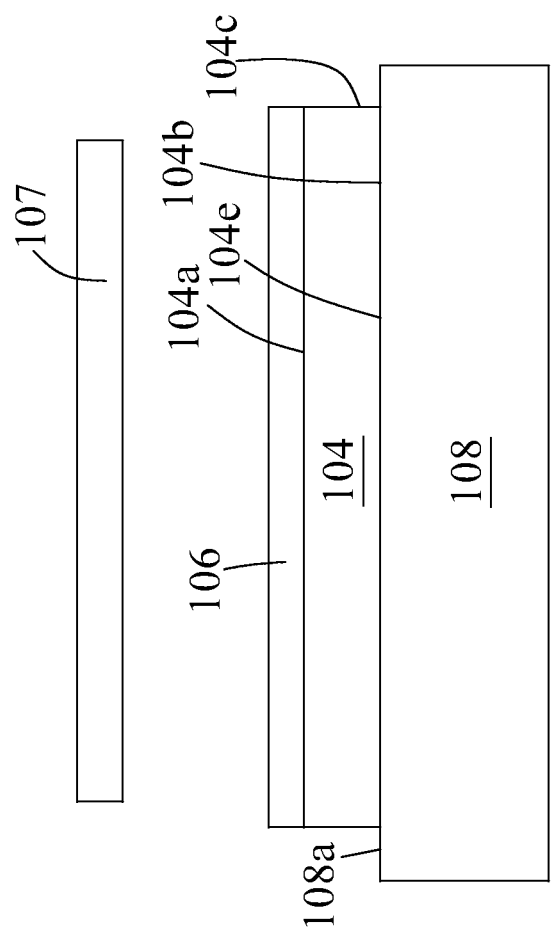

In operation 205, a heating source 107 is provided as shown in FIGS. 25-27. In some embodiments as shown in FIGS. 25-26, the heating source 107 is disposed above the semiconductor structure 104 and the first plate 103. In some embodiments as shown in FIG. 25, the heating source 107 is provided inside the chamber 102. In some embodiments as shown in FIG. 26, the semiconductor structure 104 is removed from the chamber 102 of the apparatus 100 prior to the provision of the heating source 107, and thus the heating source 107 is provided outside the chamber 102.

In some embodiments as shown in FIG. 27, a second plate 108 is provided, and the semiconductor structure 104 coated with the priming layer 106 is unloaded from the first plate 103, and then loaded to the second plate 108. In some embodiments, the semiconductor structure 104 is removed from the chamber 102 after the disposing of the priming material. In some embodiments, the second plate 108 is configured to hold and support the semiconductor structure 104. In some embodiments, the second plate 108 includes a fifth surface 108a, and the fourth surface 104b of the semiconductor structure 104 is entirely in contact with the fifth surface 108a of the second plate 108 after the loading of the semiconductor structure 104 to the second plate 108. In some embodiments, the heating source 107 is disposed above the second plate 108.

In operation 206, the semiconductor structure 104 is heated by the heating source 107 as shown in FIGS. 25-27. In some embodiments as shown in FIGS. 25-26, the fourth surface 104b of the semiconductor structure 104 is entirely in contact with the first surface 103a of the first plate 103 upon the heating of the semiconductor structure 104. In some embodiments as shown in FIG. 27, the fourth surface 104b of the semiconductor structure 104 is entirely in contact with the fifth surface 108a of the second plate 108. In some embodiments, the heating of the semiconductor structure 104 is implemented as the operation 206 described above.

In the present disclosure, a method of manufacturing a semiconductor structure is disclosed. The method includes providing a plate including a recess, disposing a semiconductor structure over the plate, disposing a priming material over the semiconductor structure and heating the semiconductor structure coated with the priming material by a heating source disposed above the plate and the semiconductors structure. Since a peripheral portion of a backside of the semiconductor structure is in contact with the plate, formation of unwanted particles on the backside can be reduced or prevented. Further, since the plate having the recess is used upon the disposing of the priming material, the heating source is installed above the plate and the semiconductor structure.

In some embodiments, a method includes providing a first plate including a first surface, a second surface opposite to the first surface, and a first recess indented from the first surface towards the second surface; providing a semiconductor structure including a third surface, a fourth surface opposite to the third surface, and a first sidewall extending between the third surface and the fourth surface; placing the semiconductor structure over the first plate; and disposing a priming material over the third surface of the semiconductor structure, wherein a peripheral portion of the fourth surface of the semiconductor structure is in contact with the first surface of the first plate upon the disposing of the priming material.

In some embodiments, a central portion of the fourth surface of the semiconductor structure is disposed above the first recess. In some embodiments, the central portion of the fourth surface of the semiconductor structure is surrounded or enclosed by the peripheral portion of the fourth surface of the semiconductor structure. In some embodiments, a first width of the periphery portion of the semiconductor structure contacted with the first surface of the first plate is substantially less than or equal to a second width of the first surface of the first plate. In some embodiments, a first thickness of the first plate between the first surface and the second surface is substantially greater than a second thickness of the first plate between a bottom surface of the first recess and the second surface of the first plate.

In some embodiments, the first sidewall of the semiconductor structure is disposed above the first surface of the first plate. In some embodiments, at least a portion of the first sidewall of the semiconductor structure is in contact with and surrounded by the first plate. In some embodiments, the first plate includes a second recess disposed above the first recess and indented into the first plate, a portion of the semiconductor structure is disposed within the second recess and surrounded by the first plate. In some embodiments, the first plate includes a second recess disposed adjacent to the first recess and indented from the first surface towards the second surface.

In some embodiments, the method further includes providing a heating source above the semiconductor structure; heating the semiconductor structure by the heating source. In some embodiments, the heating of the semiconductor structure includes emitting a predetermined electromagnetic radiation from the heating source to increase a temperature of the semiconductor structure. In some embodiments, the predetermined electromagnetic radiation includes ultra violet (UV), infra-red (IR) or an electromagnetic radiation with a wavelength of substantially greater than 365 nm, which is typically used for curing operations. In some embodiments, the method further includes unloading the semiconductor structure from the first plate after the disposing of the priming material; providing a second plate including a fifth surface; loading the semiconductor structure to the second plate. In some embodiments, the fifth surface is entirely in contact with the fourth surface of the semiconductor structure.

In some embodiments, a method includes providing a plate including a first surface, a second surface opposite to the first surface; providing a semiconductor structure including a third surface, a fourth surface opposite to the third surface; placing the semiconductor structure over the plate; disposing a priming material over the third surface of the semiconductor structure; providing a heating source disposed above the plate and the semiconductor structure; and heating the semiconductor structure by the heating source.

In some embodiments, the fourth surface of the semiconductor structure is entirely in contact with the first surface of the plate upon the disposing of the priming material and the heating of the semiconductor structure. In some embodiments, the heating source is above the priming material disposed over the semiconductor structure after the disposing of the priming material. In some embodiments, a distance between the heating source and the third surface of the semiconductor structure is substantially greater than 1 um.

In some embodiments, the method includes providing a first plate including a first surface, a second surface opposite to the first surface, and a recess indented from the first surface towards the second surface; providing a semiconductor structure including a third surface, a fourth surface opposite to the third surface; placing the semiconductor structure over the first plate; disposing a priming material over the third surface of the semiconductor structure; providing a second plate; loading the semiconductor structure from the first plate to the second plate; providing a heating source disposed above the second plate and the third surface of the semiconductor structure; and heating the semiconductor structure by the heating source.

In some embodiments, the semiconductor structure is disposed over the first plate upon the disposing of the priming material and is disposed over the second plate upon the heating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing an integrally formed first plate, wherein the first plate includes a planar top surface at a first elevation and a first recess indented from the top surface;
placing a semiconductor structure over the first plate so as to contact a peripheral portion of a bottom surface of the semiconductor structure with a first portion of the top surface of the first plate, wherein the peripheral portion of the bottom surface of the semiconductor structure and the first portion of the top surface are at the first elevation; and
disposing a priming material over a top surface of the semiconductor structure, wherein at least a second portion of the top surface of the first plate is exposed from the semiconductor structure upon the disposing of the priming material, wherein the second portion is aligned with the first portion at the first elevation.

2. The method of claim 1, wherein a central portion of the bottom surface of the semiconductor structure is disposed above the first recess.

3. The method of claim 2, wherein the central portion of the bottom surface of the semiconductor structure is surrounded or enclosed by the peripheral portion of the bottom surface of the semiconductor structure.

4. The method of claim 1, wherein the second portion surrounds or encloses the first portion of the top surface of the first plate.

5. The method of claim 1, wherein an entirety of the semiconductor structure is disposed above the first plate.

6. The method of claim 1, wherein the first plate further comprises a second recess indented from the top surface of the first plate and horizontally adjacent to the first recess.

7. The method of claim 6, wherein the semiconductor structure covers the second recess upon the disposing of the priming material.

8. The method of claim 1, further comprising:
providing a heating source above the semiconductor structure; and
heating the semiconductor structure by the heating source.

9. The method of claim 8, wherein the heating of the semiconductor structure includes emitting a predetermined electromagnetic radiation from the heating source to increase a temperature of the semiconductor structure.

10. The method of claim 9, wherein the predetermined electromagnetic radiation includes ultra-violet (UV), infra-red (IR) or an electromagnetic radiation with a wavelength of substantially greater than 365 nm.

11. The method of claim 8, further comprising:
unloading the semiconductor structure from the first plate after the disposing of the priming material; and
loading the semiconductor structure to a second plate.

12. The method of claim 11, wherein a portion of a top surface of the second plate is exposed during the heating of the semiconductor structure.

13. The method of claim 1, wherein the top surface extends continuously from the first recess toward a sidewall of the first plate.

14. A method, comprising:
disposing a semiconductor structure over a monolithic plate, wherein the plate includes a first recess indented from a top surface of the plate and a second recess indented from a bottom surface of the first recess, the top surface of the plate is at a first elevation, and the bottom surface of the first recess is at a second elevation below the first elevation, and a thickness of the semiconductor structure is greater than a depth of the first recess;
contacting the semiconductor structure with a sidewall of the first recess, wherein the semiconductor structure includes a sidewall, and a portion of the sidewall of the semiconductor structure is above the top surface of the plate; and
disposing a priming material over a top surface of the semiconductor structure.

15. The method of claim 14, further comprising:
moving the semiconductor structure toward the bottom surface of the first recess until a bottom surface of the semiconductor structure contacting the bottom surface of the first recess, wherein the bottom surface of the first recess contacts a peripheral region of the bottom surface of the semiconductor structure, the peripheral region connects to the sidewall of the semiconductor structure, an entirety of a central region of the bottom surface of the semiconductor structure is exposed to the second recesses, and the central region is encircled by and connecting the peripheral region.

16. The method of claim 14, further comprising:
providing a heating source disposed above the semiconductor structure; and
heating the semiconductor structure by the heating source.

17. The method of claim 16, wherein the heating of the semiconductor structure is performed after the disposing of the priming material.

18. The method of claim 16, wherein a distance between the heating source and the top surface of the semiconductor structure is substantially greater than 1 um.

19. A method, comprising:
disposing a semiconductor structure over an integrally formed plate in a housing, wherein the plate includes a planar top surface at a first elevation and a first recess indented from the top surface;
moving the semiconductor structure toward the plate until a peripheral portion of a bottom surface of the semiconductor structure contacts a first portion of the top surface of the plate proximal to the first recess, wherein the peripheral portion of the bottom surface of the semiconductor structure and the first portion of the top surface are at the first elevation; and
forming a priming layer over a top surface of the semiconductor structure, wherein at least a second portion of the top surface of the first plate is exposed from the semiconductor structure during the formation of the priming material, wherein the second portion is farther away from the first recess than the first portion is, and the second portion is aligned with the first portion at the first elevation.

20. The method of claim 19, wherein the housing includes a first passage disposed above the plate allowing a priming material flowing into the housing during the formation of the priming layer.

* * * * *